United States Patent
Ohba et al.

(10) Patent No.: US 10,971,685 B2
(45) Date of Patent: Apr. 6, 2021

(54) SELECTIVE DEVICE, MEMORY CELL, AND STORAGE UNIT

(71) Applicant: SONY CORPORATION, Tokyo (JP)

(72) Inventors: Kazuhiro Ohba, Tokyo (JP); Minoru Ikarashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/545,923

(22) PCT Filed: Jan. 8, 2016

(86) PCT No.: PCT/JP2016/050539
§ 371 (c)(1),
(2) Date: Jul. 24, 2017

(87) PCT Pub. No.: WO2016/129306
PCT Pub. Date: Aug. 18, 2016

(65) Prior Publication Data
US 2018/0019391 A1  Jan. 18, 2018

(30) Foreign Application Priority Data
Feb. 10, 2015 (JP) .............................. JP2015-024608

(51) Int. Cl.
*H01L 45/00* (2006.01)
*H01L 27/105* (2006.01)
(Continued)

(52) U.S. Cl.
CPC ........ *H01L 45/1253* (2013.01); *H01L 27/105* (2013.01); *H01L 27/1052* (2013.01);
(Continued)

(58) Field of Classification Search
CPC ............... H01L 45/149; H01L 45/1233; H01L 45/1253; H01L 27/2427; H01L 27/1052; H01L 27/2481; H01L 27/105; H01L 49/02
See application file for complete search history.

(56) References Cited

U.S. PATENT DOCUMENTS 6,141,241 A  10/2000  Ovshinsky et al.
2003/0183867 A1*  10/2003  Fricke ................... H01L 27/101
257/314

(Continued)

FOREIGN PATENT DOCUMENTS

AU  4821999 A  1/2000
AU  4081600 A  11/2000
(Continued)

OTHER PUBLICATIONS

International Search Report and Written Opinion of PCT Application No. PCT/JP2016/050539, dated Mar. 15, 2016, 02 pages of English Translation and 08 pages of ISRWO.
(Continued)

*Primary Examiner* — Wael M Fahmy
*Assistant Examiner* — Sarah K Salerno
(74) *Attorney, Agent, or Firm* — Chip Law Group

(57) ABSTRACT

A selective device includes a first electrode, a second electrode, a switch device, and a non-linear resistive device. The second electrode is disposed to face the first electrode. The switch device is provided between the first electrode and the second electrode. The non-linear resistive device contains one or more of boron (B), silicon (Si), and carbon (C). The non-linear resistive device is coupled to the switch device in series.

16 Claims, 22 Drawing Sheets

(51) Int. Cl.
*H01L 27/24* (2006.01)
*H01L 49/02* (2006.01)
*H01L 27/22* (2006.01)

(52) U.S. Cl.
CPC ...... *H01L 27/2427* (2013.01); *H01L 27/2481* (2013.01); *H01L 49/02* (2013.01); *H01L 27/224* (2013.01); *H01L 45/08* (2013.01); *H01L 45/085* (2013.01); *H01L 45/1233* (2013.01)

(56) References Cited

U.S. PATENT DOCUMENTS

| | | | |
|---|---|---|---|
| 2007/0103963 | A1 | 5/2007 | Kim et al. |
| 2010/0084625 | A1* | 4/2010 | Wicker ............... H01L 45/04 257/4 |
| 2010/0259967 | A1 | 10/2010 | Yasuda et al. |
| 2011/0233500 | A1 | 9/2011 | Nishimura et al. |
| 2011/0235400 | A1 | 9/2011 | Shimotori et al. |
| 2013/0134383 | A1* | 5/2013 | Hwang ............... H01L 45/16 257/5 |
| 2013/0221314 | A1* | 8/2013 | Pramanik ............. H01L 45/08 257/4 |
| 2014/0295638 | A1 | 10/2014 | Pio |

FOREIGN PATENT DOCUMENTS

| | | |
|---|---|---|
| BR | 0006031 A | 3/2001 |
| CA | 2332867 A1 | 10/2000 |
| CN | 1963946 A | 5/2007 |
| CN | 101868855 A | 10/2010 |
| CN | 104718625 A | 6/2015 |
| DE | 60037301 T2 | 11/2008 |
| EP | 1104578 A1 | 6/2001 |
| EP | 2891184 A1 | 7/2015 |
| JP | 2002-541613 A | 12/2002 |
| JP | 2006-351779 A | 12/2006 |
| JP | 2007-134676 A | 5/2007 |
| JP | 2009-135206 A | 6/2009 |
| JP | 2011-198439 A | 10/2011 |
| JP | 2011-199197 A | 10/2011 |
| JP | 2015-534720 A | 12/2015 |
| KR | 10-0695164 B1 | 3/2007 |
| KR | 10-2010-0089857 A | 8/2010 |
| KR | 10-2015-0046149 A | 4/2015 |
| MX | PA00011876 A | 10/2002 |
| RU | 2216054 C2 | 11/2003 |
| TW | 200947674 A | 11/2009 |
| WO | 2000/062301 A1 | 4/2000 |
| WO | 2009/069690 A1 | 11/2008 |
| WO | 2014/036461 A1 | 3/2014 |
| WO | 2016/129306 A1 | 8/2016 |

OTHER PUBLICATIONS

Office Action for JP Patent Application No. 2016-574687, dated Oct. 8, 2019, 07 pages of Office Action and 07 pages of English Translation.

Office Action for JP Patent Application No. 2016-574687, dated Apr. 14, 2020, 03 pages of Office Action and 03 pages of English Translation.

Office Action for CN Patent Application No. 201680008329.X, dated Jul. 21, 2020, 08 pages of Office Action and 13 pages of English Translation.

\* cited by examiner

[ FIG. 1 ]
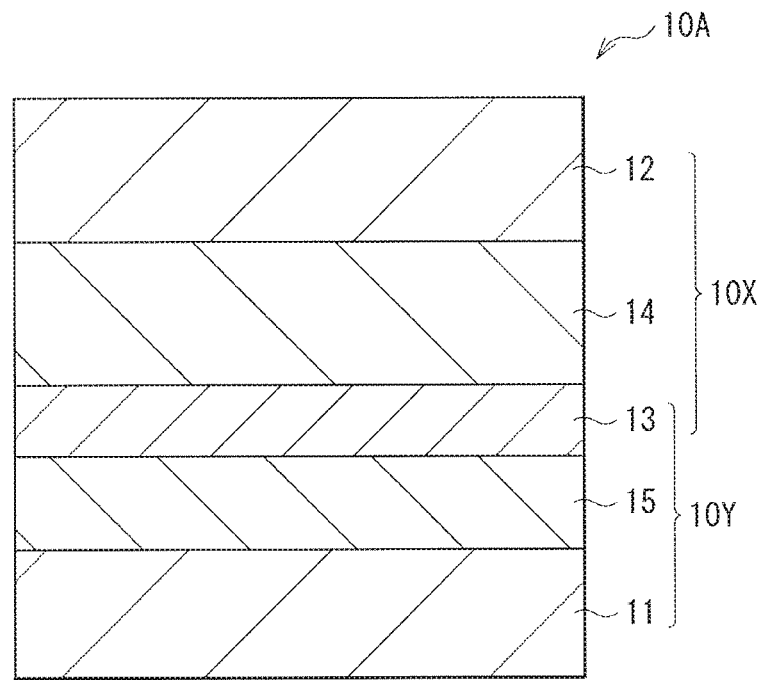
[ FIG. 2 ]
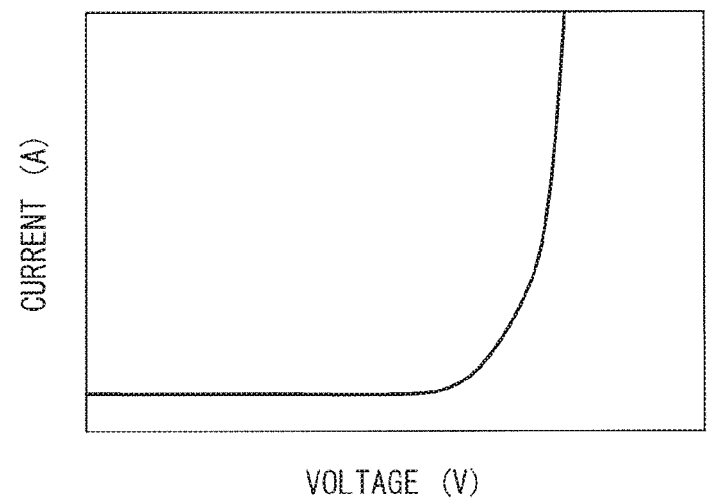

[ FIG. 3 ]
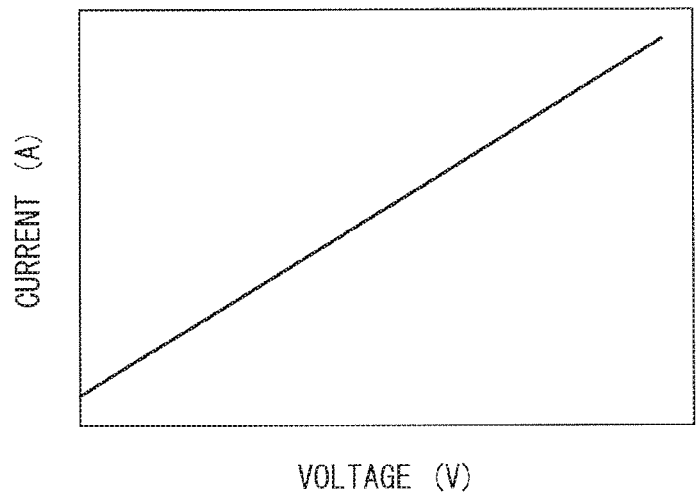
[ FIG. 4A ]
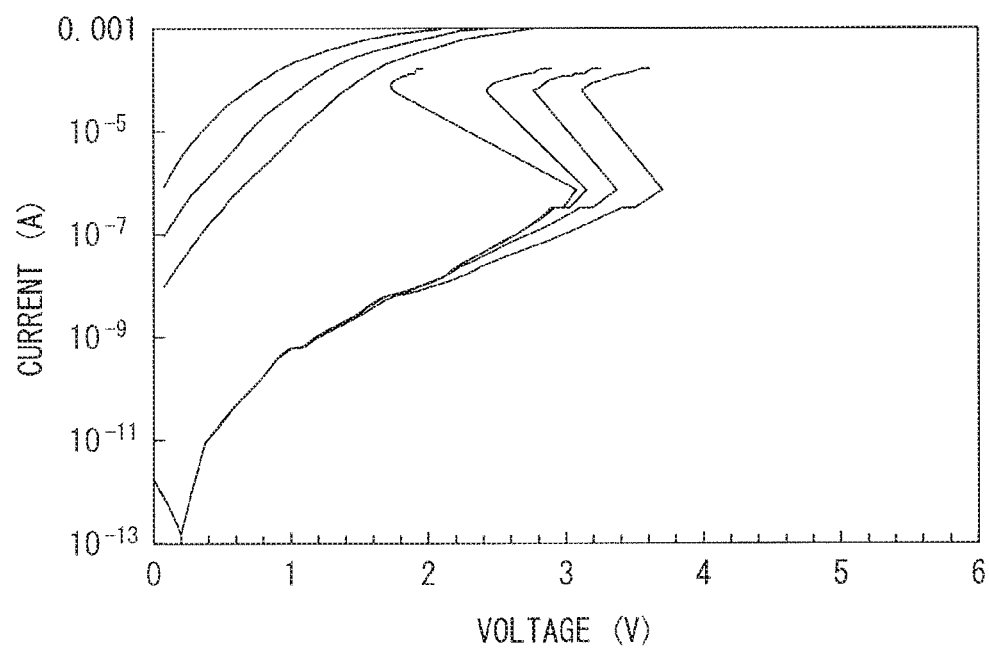

[ FIG. 4B ]
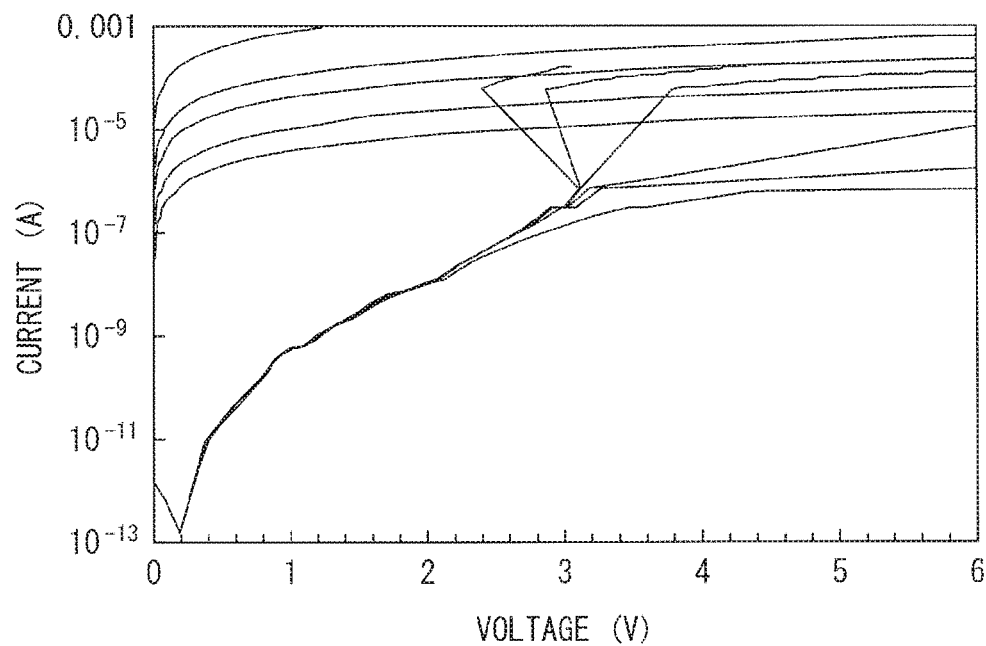
[ FIG. 5 ]
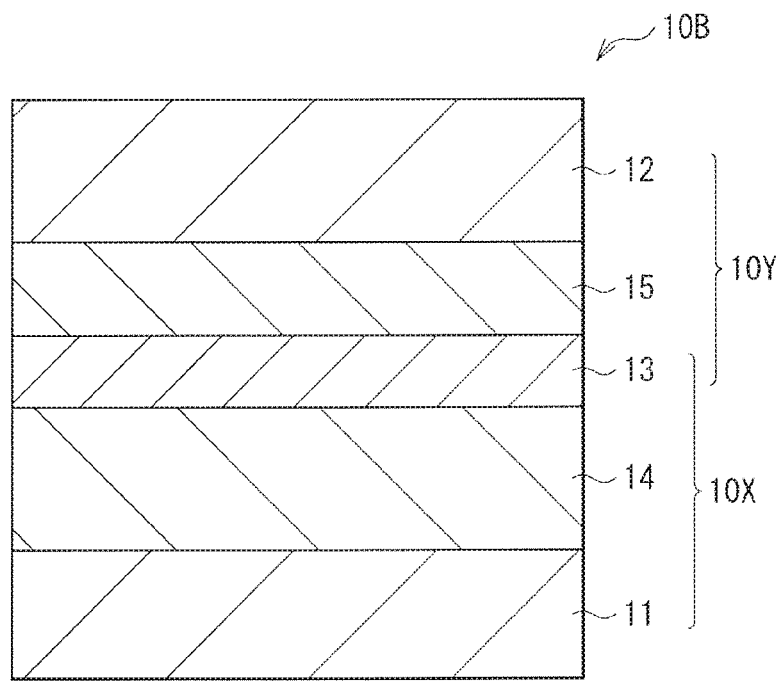

[ FIG. 6A ]
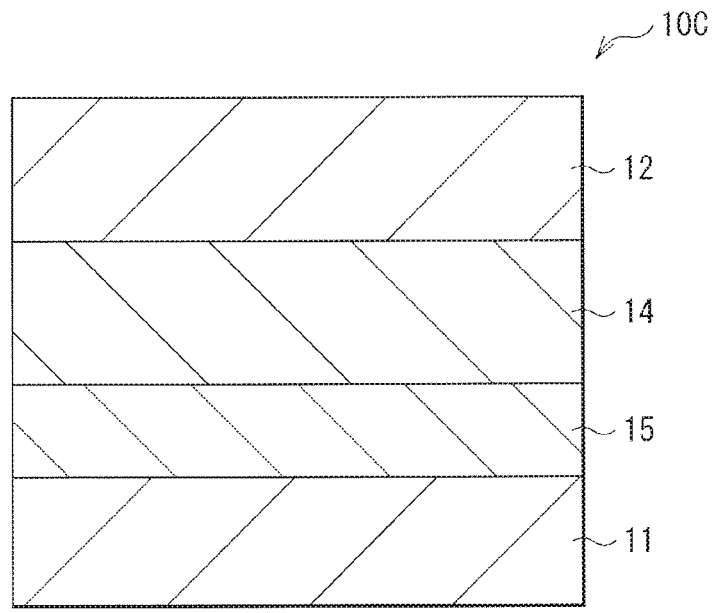
[ FIG. 6B ]
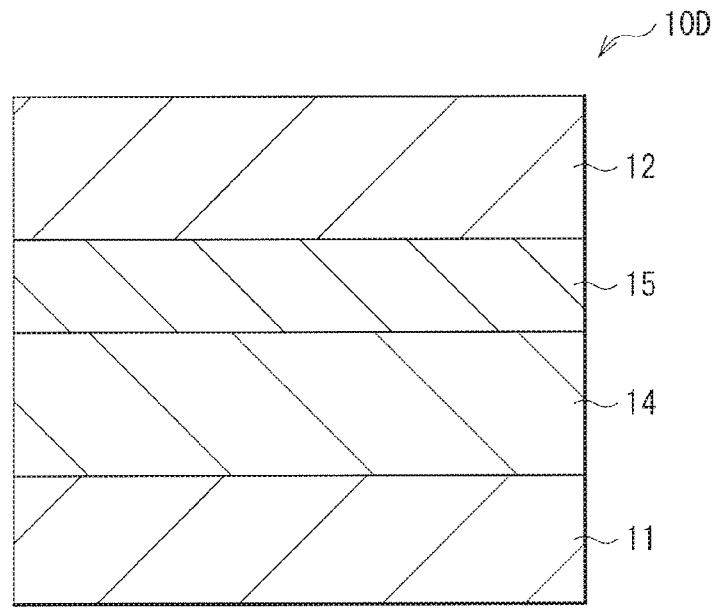

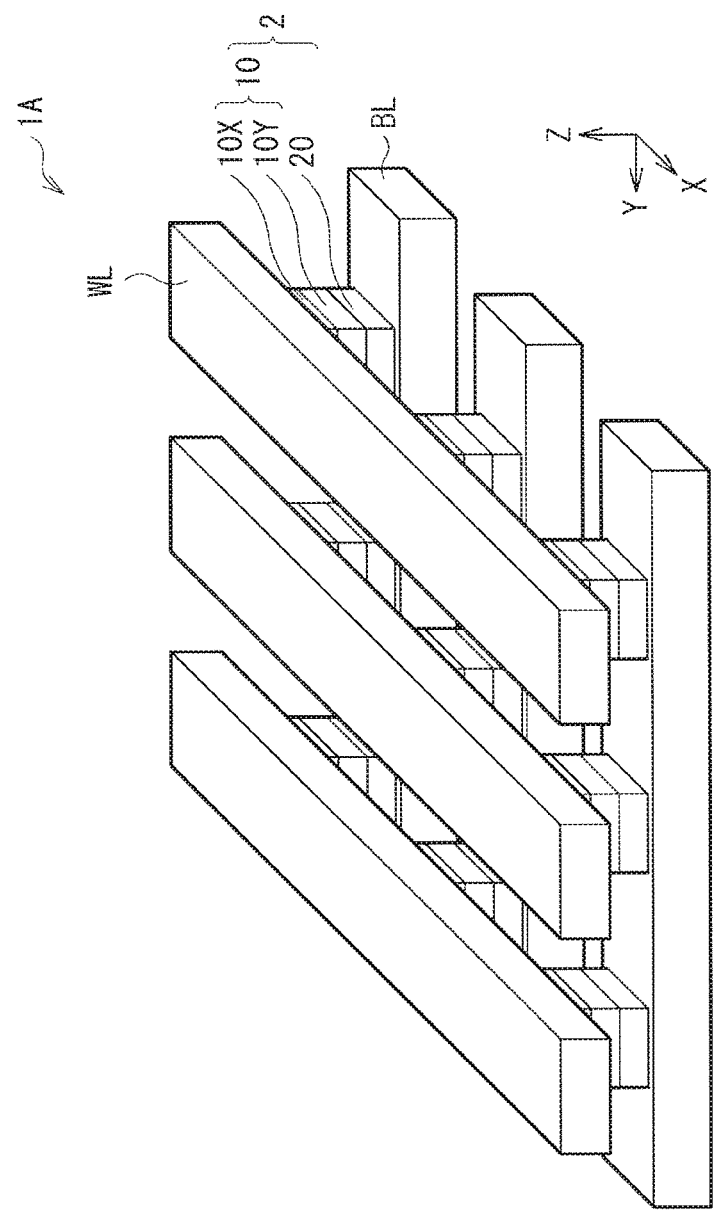
[FIG. 7]

[ FIG. 8A ]
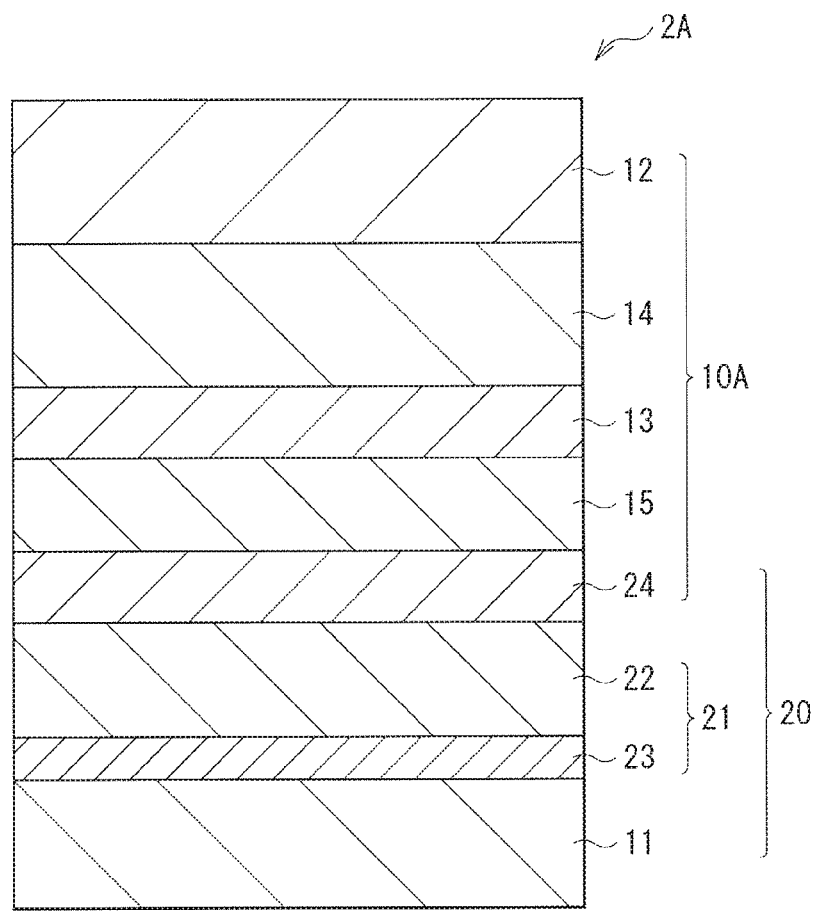

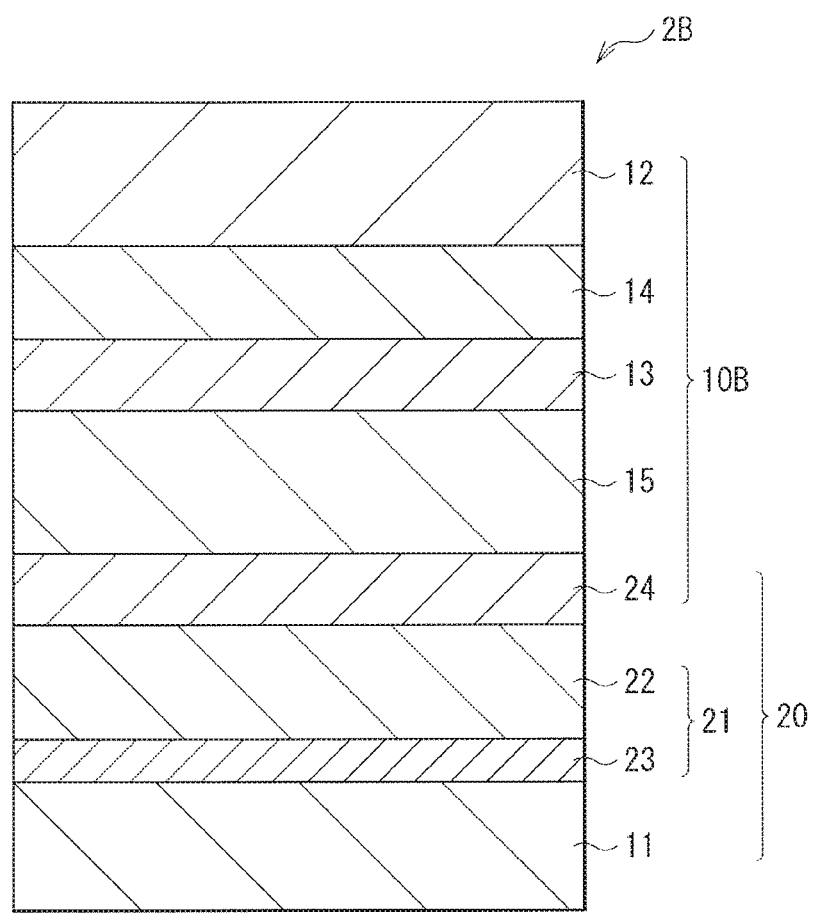
[FIG. 8B]

[ FIG. 8C ]
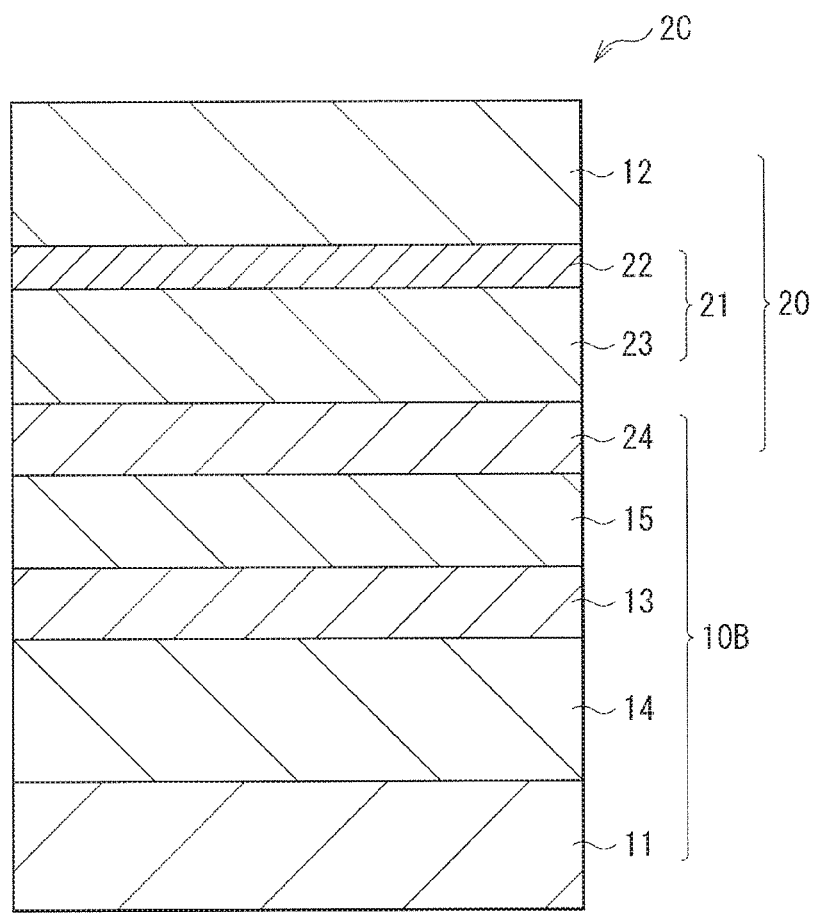

[ FIG. 8D ]
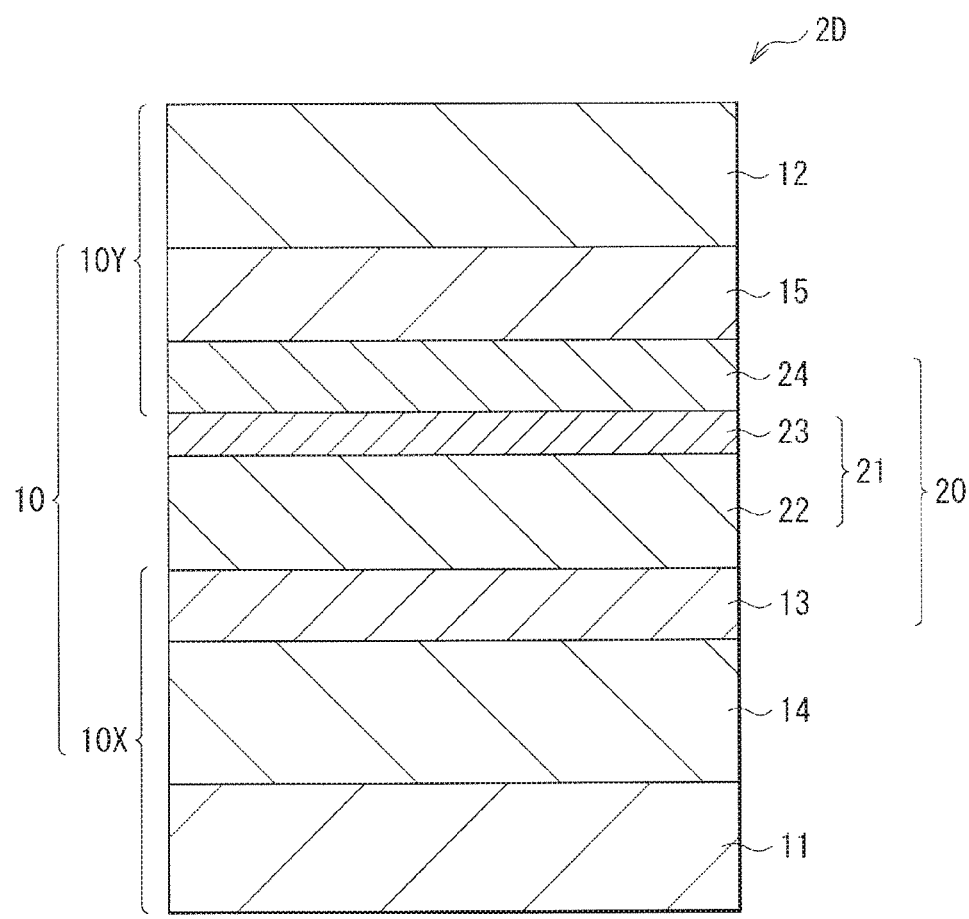

[ FIG. 8E ]
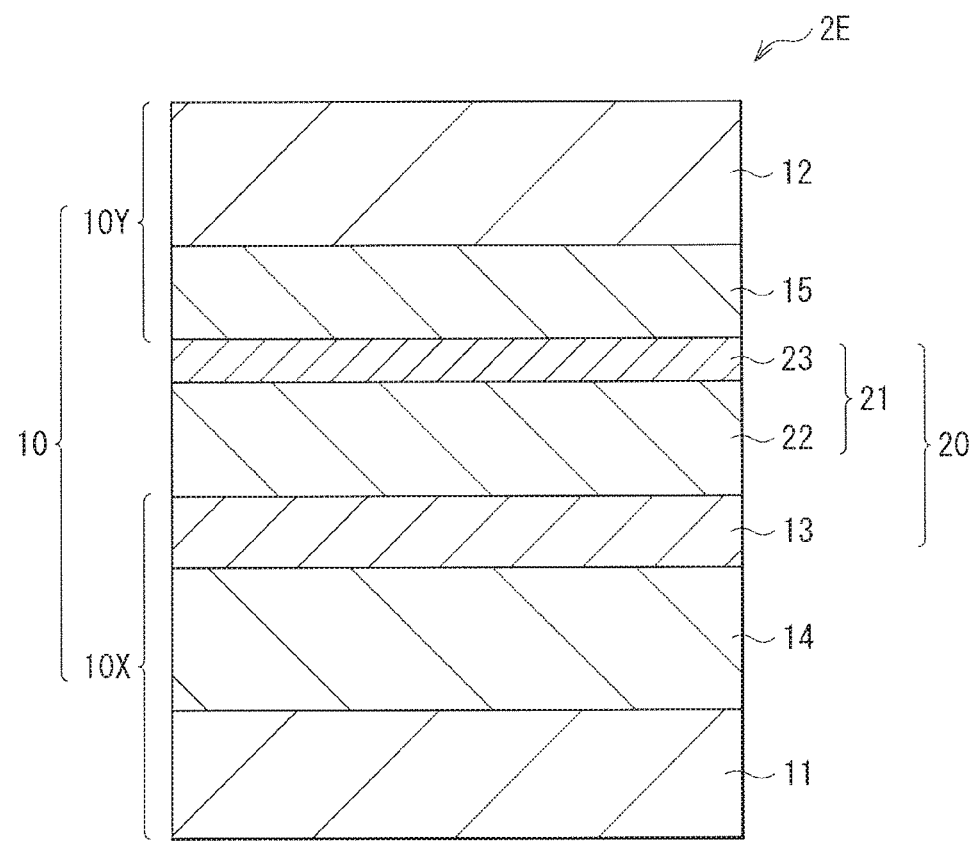

[ FIG. 8F ]
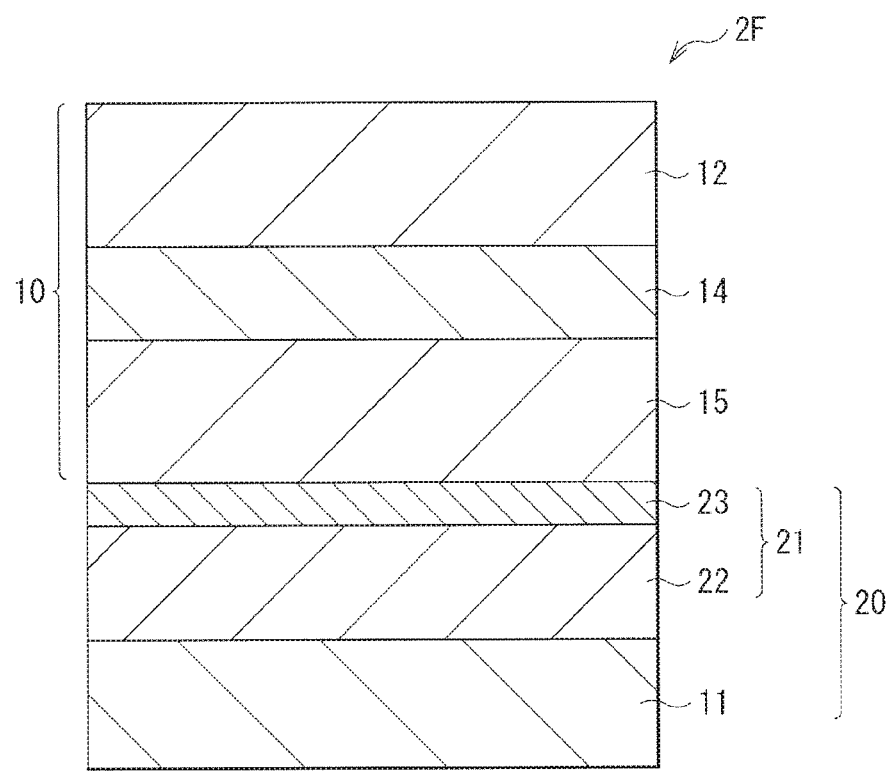

[FIG. 9]
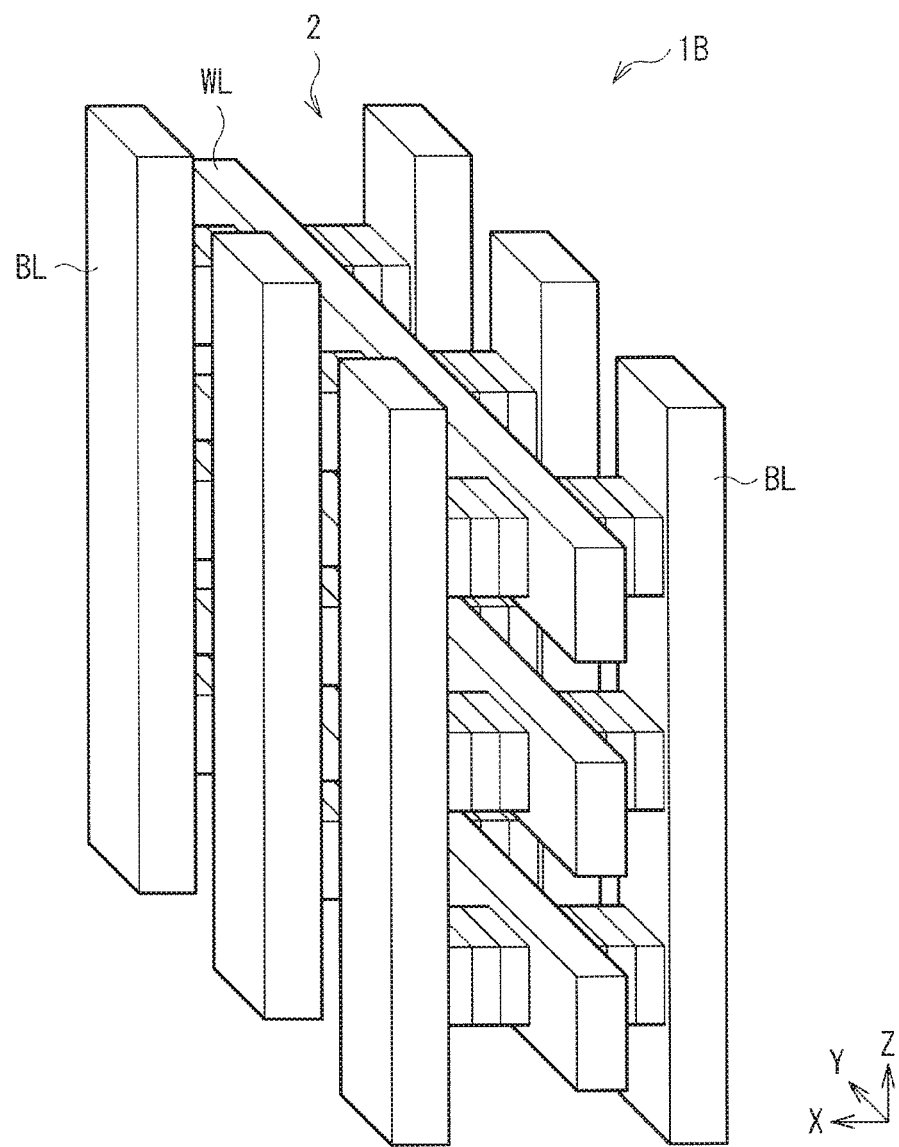

[ FIG. 10 ]
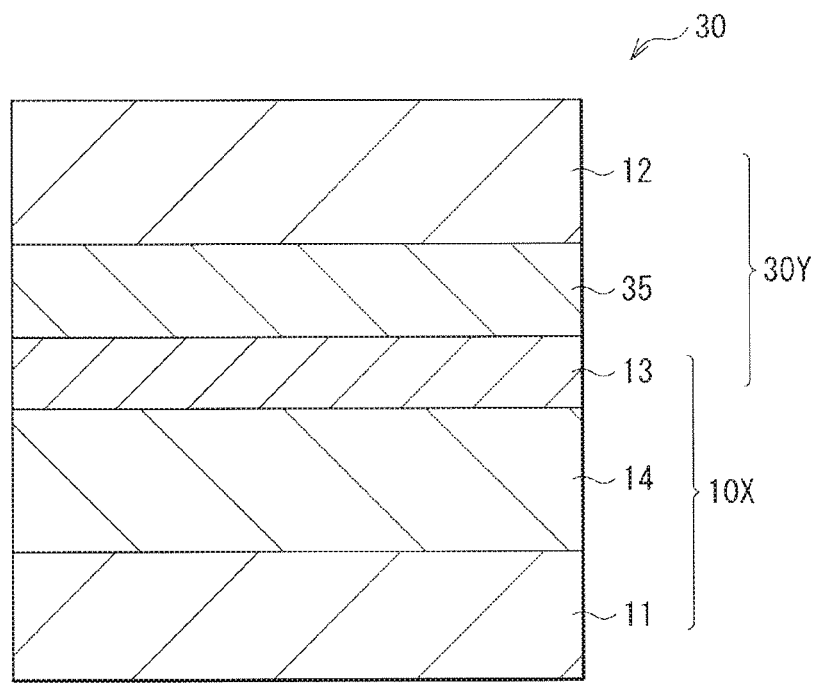

[FIG. 11]
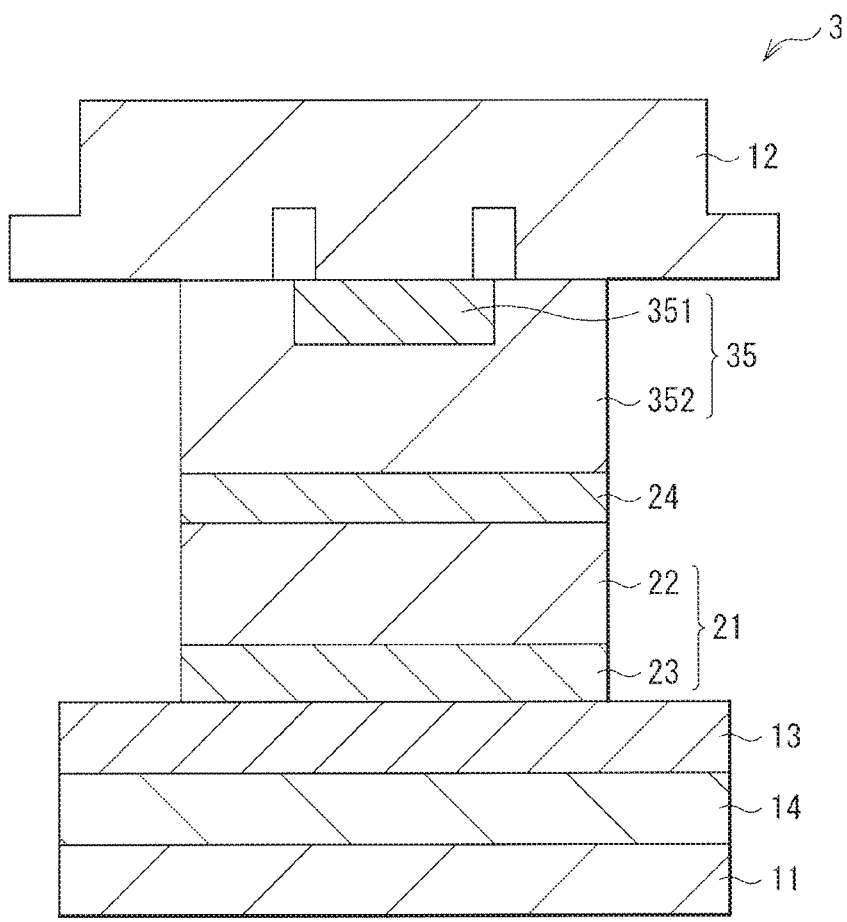

[ FIG. 12 ]
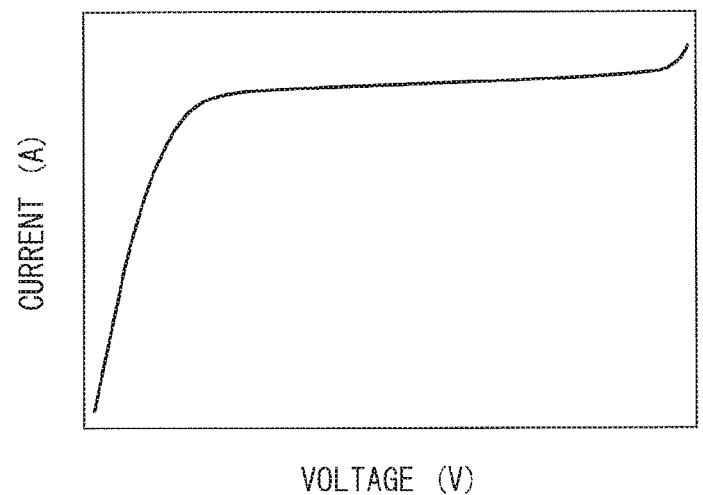
[ FIG. 13 ]
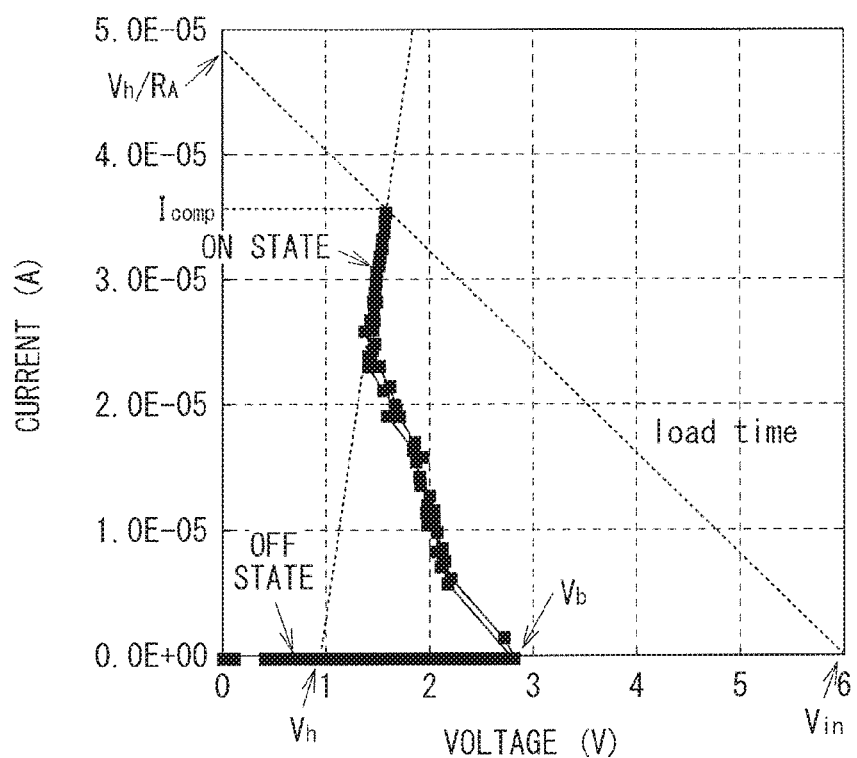

[ FIG. 14 ]
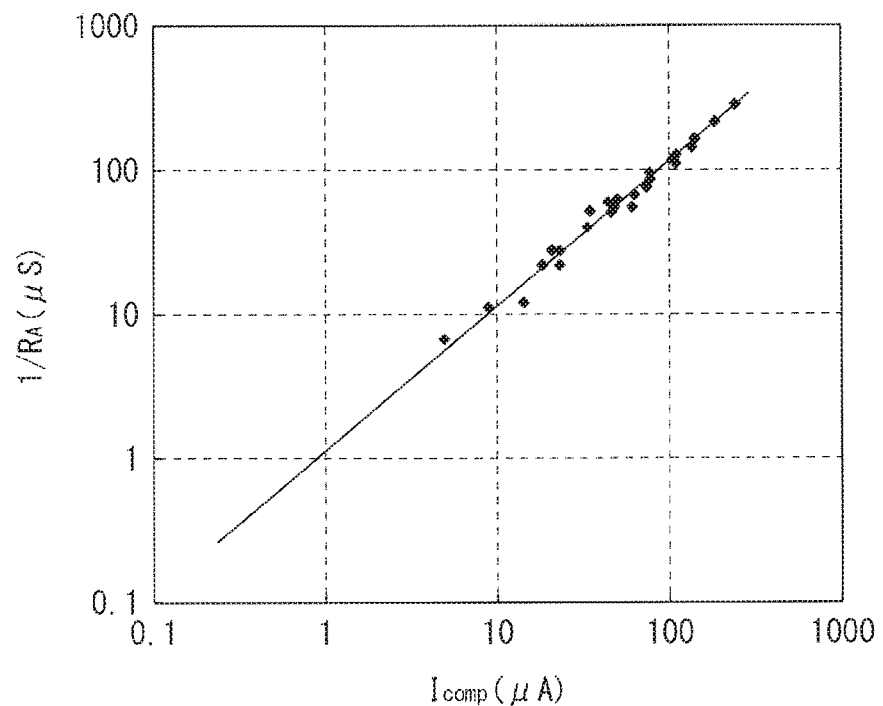
[ FIG. 15 ]
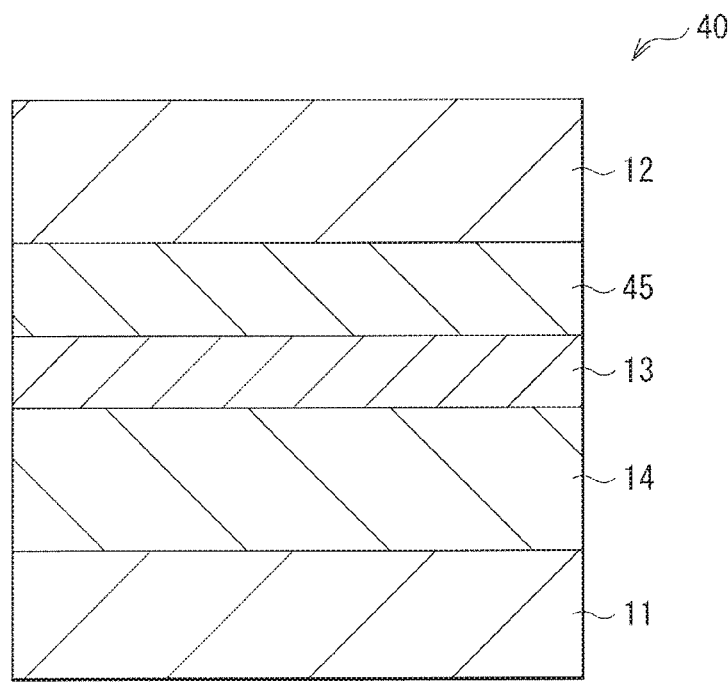

[ FIG. 16 ]
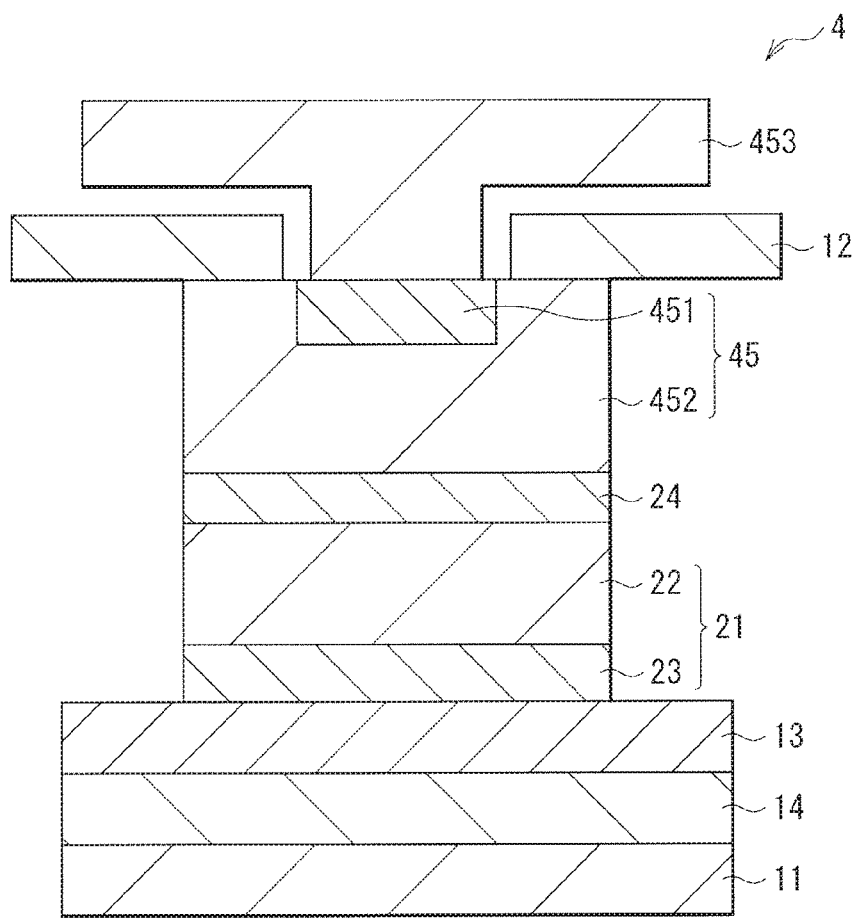

[ FIG. 17 ]
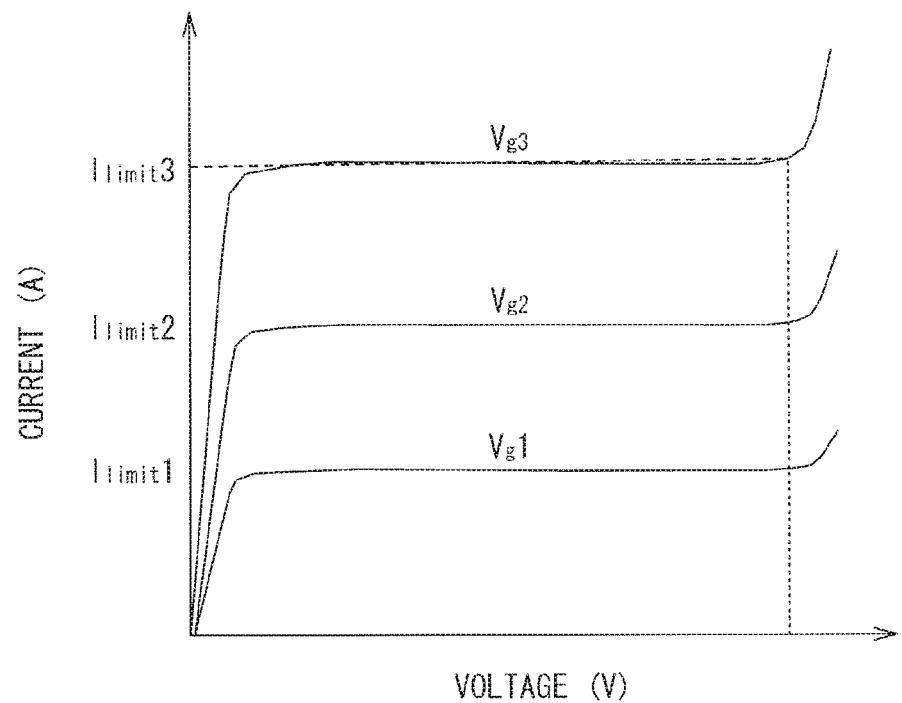

[ FIG. 18A ]
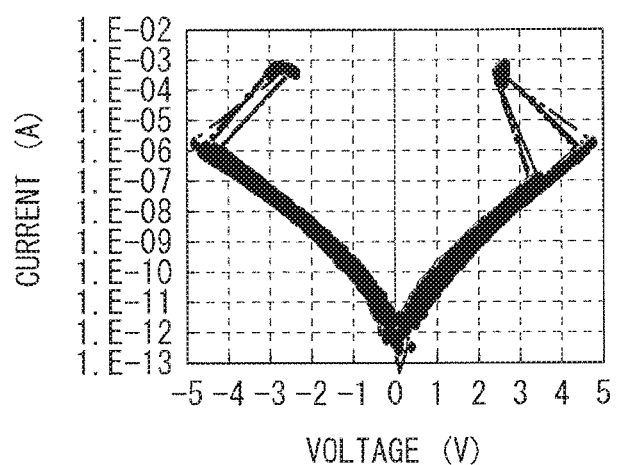
[ FIG. 18B ]
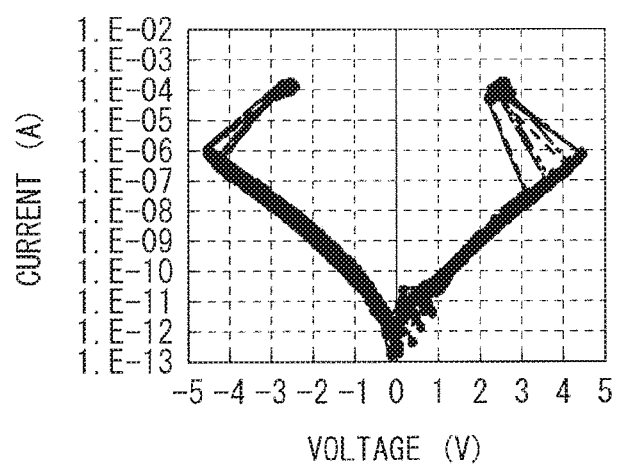
[ FIG. 18C ]
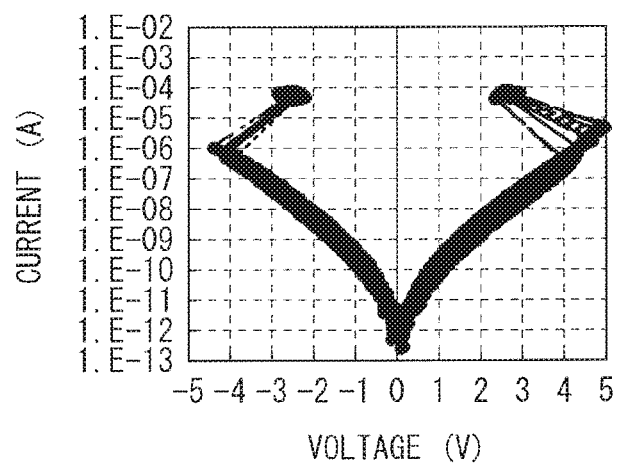

[ FIG. 19A ]
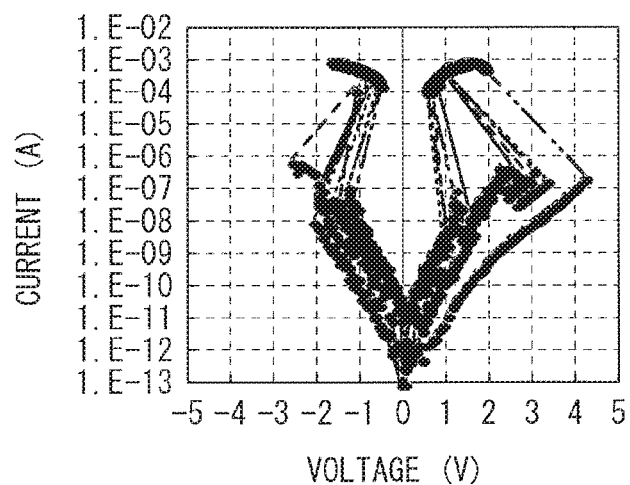
[ FIG. 19B ]
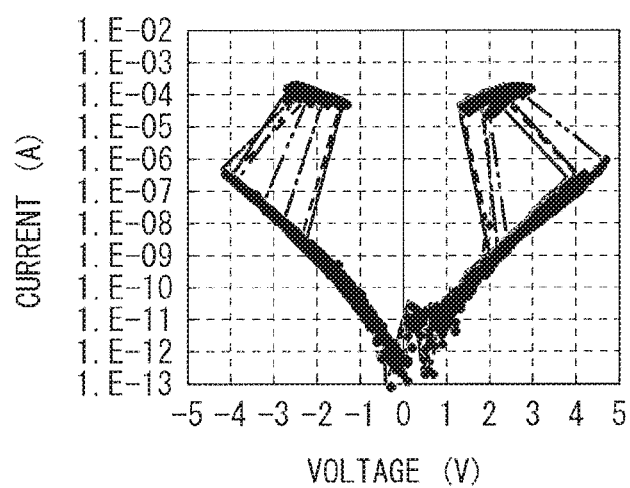
[ FIG. 19C ]
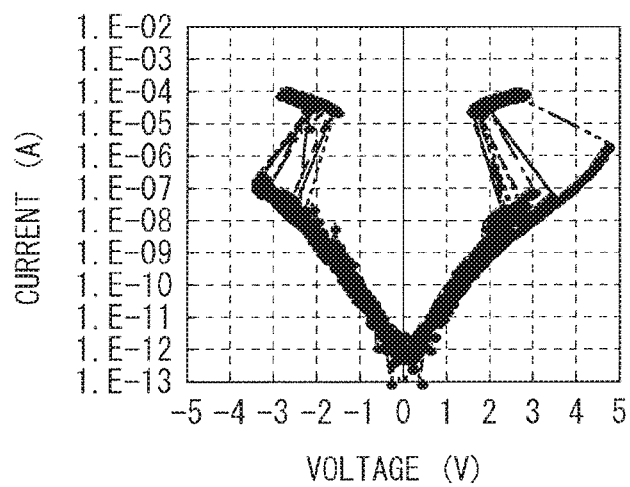

[ FIG. 20A ]
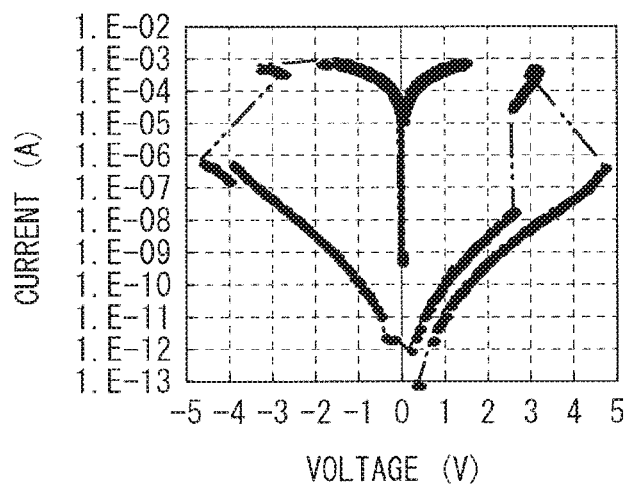
[ FIG. 20B ]
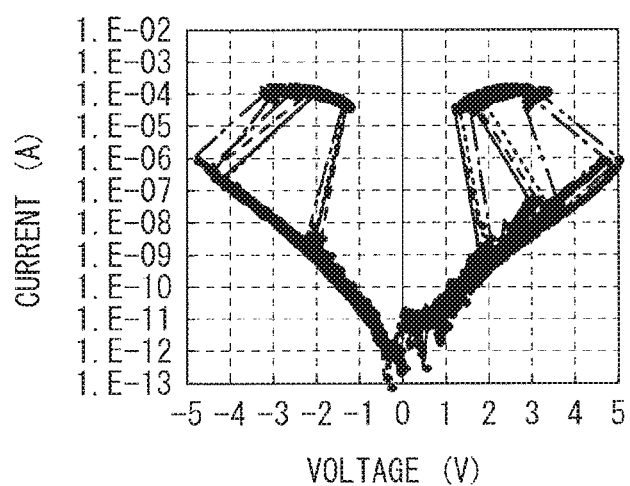
[ FIG. 20C ]
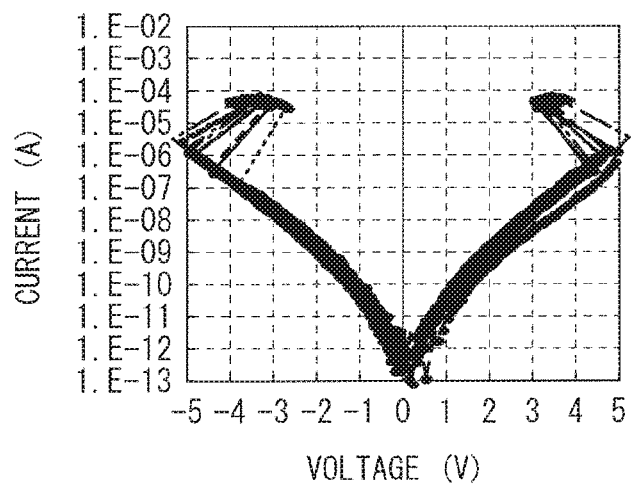

[ FIG. 21A ]
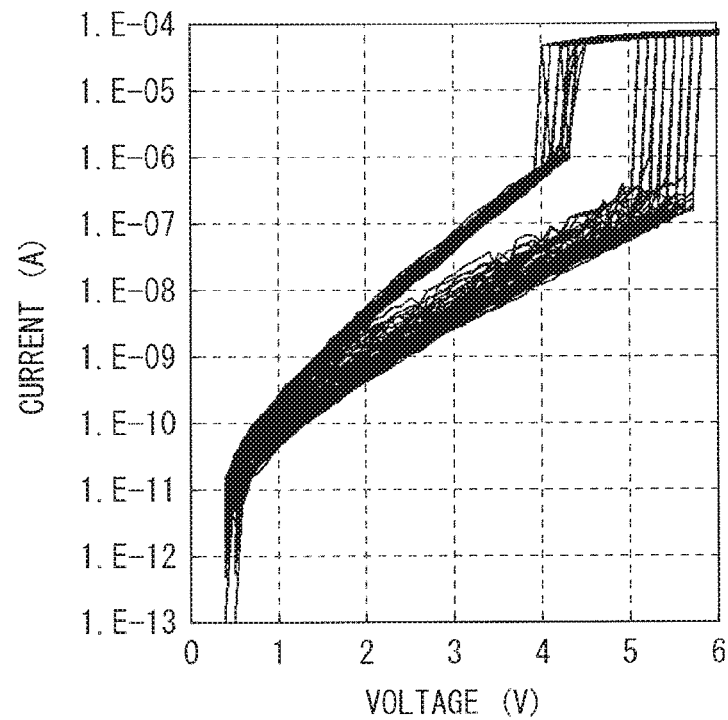
[ FIG. 21B ]
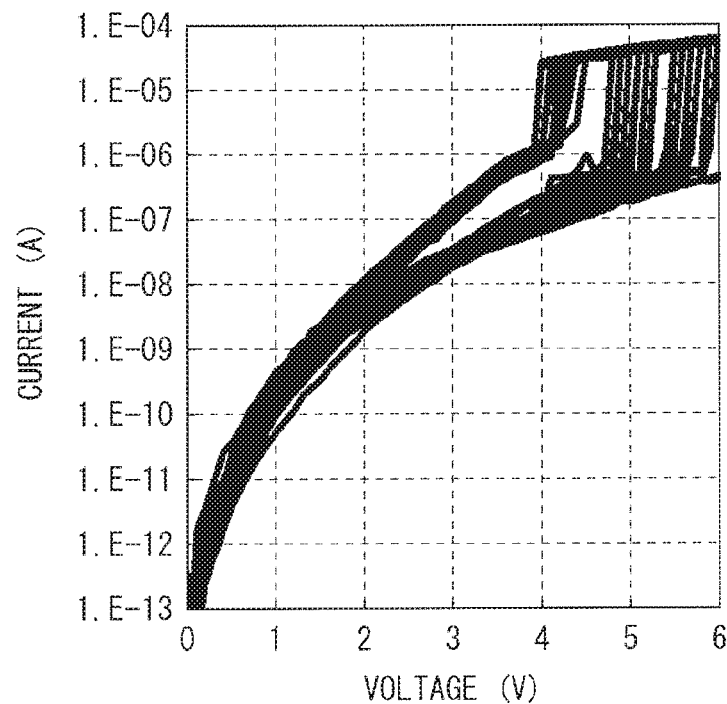

SELECTIVE DEVICE, MEMORY CELL, AND STORAGE UNIT

CROSS REFERENCE TO RELATED APPLICATIONS

This application is a U.S. National Phase of International Patent Application No. PCT/JP2016/050539 filed on Jan. 8, 2016, which claims priority benefit of Japanese Patent Application No. JP 2015-024608 filed in the Japan Patent Office on Feb. 10, 2015. Each of the above-referenced applications is hereby incorporated herein by reference in its entirety.

TECHNICAL FIELD

The disclosure relates to a selective device having a switch device between electrodes, as well as to a memory cell and a storage unit that include such a selective device.

BACKGROUND ART

In recent years, it has been requested to achieve a large-capacity non-volatile memory for data storage that is represented by a resistance-change memory such as a resistive random access memory (ReRAM) and a phase-change random access memory (PRAM). However, a resistance-change memory using a currently-available access transistor may have a large floor area per unit cell. As a result, for example, even when such a memory is further miniaturized using a same design rule in comparison with a flash memory such as a NAND type, it has been difficult to achieve large amounts of storage capacity. In contrast, the use of a so-called crosspoint array structure in which a memory device is disposed at an intersection (crosspoint) between intersecting wiring lines reduces the floor area per unit cell, making it possible to achieve large amounts of storage capacity.

A crosspoint-type memory cell is provided with selective devices for cell selection in addition to the memory devices. Examples of the selective device may include a selective device that is made using metal oxide (for example, see NPTLs 1 and 2). However, such a selective device is insufficient in a magnitude of a switching threshold voltage, and tends to suffer dielectric breakdown in a case where a high voltage is applied. Another example may be a selective device in which a resistance is switched at a certain voltage to increase (snap back) a current drastically (for example, see NPTLs 3 and 4). In such a selective device, setting a selective/non-selective voltage value by stepping across the switching threshold voltage makes it possible to allow a selective current value to be greater than that of the selective device made of a non-linear resistive material such as the metal oxide. It is necessary, however, for the switching threshold voltage of the above-described selective device to be greater than a writing threshold voltage of a memory device used in combination with each other; although the switching threshold voltage has never been considered to be sufficiently greater. Further, in a case where such a selective device is combined with a memory device having the large writing threshold voltage, the selective device is requested to assure a sufficiently large selection ratio (ON/OFF ratio) of a selective (on) state to a semi-selective (off) state; although such a selection ratio has never been considered to be sufficiently greater, either.

Other than the above-described selective devices, another example may be a selective device using a chalcogenide material, i.e., an ovonic threshold switch (OTS) (for example, see PTLs 1 and 2). The ovonic threshold switch makes it possible to achieve a relatively greater ON/OFF ratio because such a switch ensures a small leakage current in OFF state, and has a capability of increasing the current in ON state, as well as switching characteristics of being switched at a certain threshold voltage to increase the current drastically.

CITATION LIST

Patent Literature

[PTL 1] Japanese Unexamined Patent Application Publication No. 2006-86526
[PTL 2] Japanese Unexamined Patent Application Publication No. 2010-157316

Non-Patent Literature

[NPTL 1] Jiun-Jia Huang, et al. 2011 IEEE IEDM11-733-736
[NPTL 2] Wootae Lee, et al. 2012 IEEE VLSI Technology Symposium, pp. 37-38
[NPTL 3] Myungwoo Son, et al. IEEE Electron Device Letters, Vol. 32, No. 11, November 2011
[NPTL 4] Seonghyun Kim, et al. 2012 VLSI, pp. 155-156

SUMMARY OF THE INVENTION

However, in a case where such an OTS device is used as the selective device for the crosspoint-type memory cell to deliver the current having a large current density of 10 MA/cm$^2$, for example, and to further perform the operation repeatedly at such a large current density, there has been an issue in which the switching threshold voltage may drop, or variations in the switching threshold voltages may increase among a plurality of disposed OTS devices.

It is therefore desirable to provide a selective device, a memory cell, and a storage unit that make it possible to improve reliability.

A selective device according to an embodiment of the technology includes: a first electrode and a second electrode that is disposed to face the first electrode; a switch device that is provided between the first electrode and the second electrode; and a non-linear resistive device that contains one or more of boron (B), silicon (Si), and carbon (C), and is coupled to the switch device in series.

A memory cell according to an embodiment of the technology includes a memory device and the above-described selective device.

A storage unit according to an embodiment of the technology includes a plurality of memory devices and a plurality of the above-described selective devices.

In the selective device, the memory cell, and the storage unit according to the respective embodiments of the technology, the use of the non-linear resistive device that contains one or more of boron (B), silicon (Si), and carbon (C) along with the switch device makes it possible to control a current to be applied to the switch device.

According to the selective device, the memory cell, and the storage unit of the respective embodiments of the technology, the non-linear resistive device that contains one or more of boron (B), silicon (Si), and carbon (C) is used along with the switch device. This controls a current to be applied to the switch device, which makes it possible to provide the selective device, the memory cell, and the storage unit that achieve the high reliability with improved withstanding current performance. It is to be noted that effects described above are not necessarily limitative, and any of effects described in the disclosure may be provided.

BRIEF DESCRIPTION OF DRAWINGS

FIG. 1 is a cross-sectional view of an example of a configuration of a selective device according to an embodiment of the disclosure.

FIG. 2 is a characteristic diagram illustrating current-voltage characteristics of a non-linear resistive device.

FIG. 3 is a characteristic diagram illustrating current-voltage characteristics of a linear resistive device.

FIG. 4A is a characteristic diagram illustrating current-voltage characteristics of a selective device using the non-linear resistive device.

FIG. 4B is a characteristic diagram illustrating current-voltage characteristics of a selective device using the linear resistive device.

FIG. 5 is a cross-sectional view of another example of the configuration of the selective device according to an embodiment of the disclosure.

FIG. 6A is a cross-sectional view of still another example of the configuration of the selective device according to an embodiment of the disclosure.

FIG. 6B is a cross-sectional view of further still another example of the configuration of the selective device according to an embodiment of the disclosure.

FIG. 7 is a perspective view of an example of a memory cell array that includes the selective devices illustrated in FIG. 1.

FIG. 8A is a cross-sectional view of an example of a configuration of a memory cell illustrated in FIG. 7.

FIG. 8B is a cross-sectional view of another example of the configuration of the memory cell illustrated in FIG. 7.

FIG. 8C is a cross-sectional view of still another example of the configuration of the memory cell illustrated in FIG. 7.

FIG. 8D is a cross-sectional view of further still another example of the configuration of the memory cell illustrated in FIG. 7.

FIG. 8E is a cross-sectional view of further still another example of the configuration of the memory cell illustrated in FIG. 7.

FIG. 8F is a cross-sectional view of further still another example of the configuration of the memory cell illustrated in FIG. 7.

FIG. 9 is a perspective view of another example of the memory cell array that includes the selective devices illustrated in FIG. 1.

FIG. 10 is a cross-sectional view of a configuration of a selective device according to Modification Example 1 of the disclosure.

FIG. 11 is a cross-sectional view of a memory cell that includes the selective device illustrated in FIG. 10.

FIG. 12 is a characteristic diagram illustrating current-voltage characteristics of a non-linear resistive device used for the selective device illustrated in FIG. 10.

FIG. 13 is a characteristic diagram illustrating current-voltage characteristics of a typical switch device.

FIG. 14 is a characteristic diagram illustrating a relationship between an inverse of a set resistance and a current of a typical memory device.

FIG. 15 is a cross-sectional view of a configuration of a selective device according to Modification Example 2 of the disclosure.

FIG. 16 is a cross-sectional view of a memory cell that includes the selective device illustrated in FIG. 15.

FIG. 17 is a characteristic diagram illustrating current-voltage characteristics of a non-linear resistive device used for the selective device illustrated in FIG. 16.

FIGS. 18A, 18B and 18C are current-voltage characteristic diagrams of each current density in Experimental Example 1-1.

FIGS. 19A, 19B and 19C are current-voltage characteristic diagrams of each current density in Experimental Example 1-2.

FIGS. 20A, 20B and 20C are current-voltage characteristic diagrams of each current density in Experimental Example 1-3.

FIG. 21A is a current-voltage characteristic diagram in Experimental Example 2-1.

FIG. 21B is a current-voltage characteristic diagram in Experimental Example 2-2.

MODES FOR CARRYING OUT THE INVENTION

Hereinafter, some embodiments of the disclosure are described with reference to the drawings in the following order.
1. Embodiment (a selective device that includes a switch device and a non-linear resistive device)
   1-1. Selective Device
   1-2. Storage Unit
2. Modification Examples (an example where a constant-current diode is used as a non-linear resistive device)
   2-1. Modification Example 1
   2-2. Modification Example 2
3. Working Examples 1. Embodiment 1-1. Selective Device FIG. 1 illustrates a cross-sectional configuration of a selective device (a selective device 10A) according to an embodiment of the disclosure. The selective device 10A serves to selectively operate any of a plurality of memory devices (memory devices 20 in FIG. 7) that are disposed in a memory cell array (a memory cell array 1A) having a so-called crosspoint array structure as illustrated in FIG. 7, for example. In the present embodiment, the selective device 10A (a selective device 10 in FIG. 7) is configured in such a manner that a switch device 10X and a non-linear resistive device 10Y having the current-voltage characteristics illustrated in FIG. 2 are coupled in series. Specifically, the selective device 10A has a configuration in which, between a lower electrode 11 (first electrode) and an upper electrode 12 (second electrode) that are disposed to face each other, a non-linear resistive layer 15 configuring the non-linear resistive device 10Y and a switch layer 14 configuring the switch device 10X are stacked in this order from the lower electrode 11 with an intermediate electrode 13 in between. That is, the switch device 10X and the non-linear resistive device 10Y share the intermediate electrode 13 with each other, and the switch device 10X is configured by the intermediate electrode 13, the switch layer 14, and the upper electrode 12, while the non-linear resistive device 10Y is configured by the lower electrode 11, the non-linear resistive layer 15, and the intermediate electrode 13.

The lower electrode 11 contains a wiring material used for a semiconductor process, such as tungsten (W), tungsten nitride (WN), titanium nitride (TiN), copper (Cu), aluminum (Al), molybdenum (Mo), tantalum (Ta), tantalum nitride (TaN), and silicide. In a case where the lower electrode 11 is made of a material that has a possibility of generating field ion conduction, such as Cu, or any other equivalent material, a surface of the lower electrode 11 that is made of Cu, or any other equivalent material may be coated with a material that is less likely to generate ion conduction or thermal diffusion, such as W, WN, titanium nitride (TiN), and TaN.

For the upper electrode 12, a known semiconductor wiring material may be used as with the case of the lower electrode 11. However, a stable material may be preferable that is not reacted with the switch layer 14 even after being subjected to a post-annealing process.

The switch device 10X performs the OTS operation with application of a voltage, in which the switch layer 14 is brought into a low-resistance state by increasing an applied voltage to a certain threshold voltage or higher, and is brought into a high-resistance state by decreasing the applied voltage to the threshold voltage or lower, or by removing the applied voltage. This threshold voltage is referred to as a switching threshold voltage.

A material for the switch layer 14 may preferably have a small leakage current in OFF state and a large selection ratio. Further, it may be preferable to use a material that enables dry etching to be utilized in a manufacturing process in terms of easy microfabrication. Accordingly, as the material for the switch layer 14, it may be preferable to use an element belonging to the 16th group of the periodic system, specifically, a chalcogenide material that includes not only a chalcogen element such as sulfur (S), selenium (Se), and tellurium (Te), but also one or more of boron (B), silicon (Si), and carbon (C). Among the above-described chalcogen elements, it may be especially preferable to use Te. Moreover, addition of nitrogen (N) reduces the leakage current in OFF state. A film thickness of the switch layer 14 is not particularly limitative; however, the film thickness ranging from 3 nm to 40 nm, for example, may be preferable to reduce a thickness of the switch layer 14 and to minimize the leakage current in a non-selective (off) state.

As additive elements other than the above-described elements, the switch layer 14 may include metal elements such as aluminum (Al), magnesium (Mg), boron (B), yttrium (Y), and a rare-earth element. It is to be noted that the switch layer 14 may include any of elements other than those elements unless the effects of the disclosure are impaired.

The non-linear resistive device 10Y, which has the non-linear current-voltage characteristics as illustrated in FIG. 2, serves to protect the switch device 10X (specifically, the switch layer 14) against a drive current to be applied during write or erasure operation in a memory cell array described hereinafter. Preferably, the non-linear resistive device 10Y may have a moderate degree of non-linearity. Specifically, for example, the non-linear resistive device 10Y may desirably have the non-linearity in which the current increases by 0.5 to two orders of magnitude per one V voltage in an I-V curved line of the current-voltage characteristics. This is because the switch device 10X is made to be operated properly. In a case where the non-linearity is smaller than, for example, 0.5 order of magnitude/one V, an increase in a resistance in OFF state reduces the current flowing in ON state, which makes it difficult to fully achieve the effects of the disclosure. In contrast, in a case where the non-linearity is too large (for example, two orders of magnitude/one V are exceeded), it is difficult to protect the switch device 10X against overcurrent arising during switching operation, which makes it difficult to prevent deterioration in the switch device 10X. It is to be noted that the increased amount of current per one V voltage for the non-linear resistive device 10Y of the present embodiment is not limited within the range of 0.5 to two orders of magnitude, and may be beyond the above-described range as long as the effects of the disclosure are achieved.

A material for the non-linear resistive layer 15 may preferably contain one or more of at least B, Si, and C, and specifically the use of $B_4C$ makes it possible to increase a dielectric strength voltage of the non-linear resistive layer 15. It is to be noted that a constituent material of the non-linear resistive layer 15 may not necessarily have to adopt a so-called compound composition having a uniform composition ratio, and may be allowed to adopt any composition as long as any of B, Si, and C is contained. For example, any of B—Si—C alloy, B—Si alloy, and Si—C alloy may be used in addition to B—C alloy. Further, other than the above-described elements, oxygen (O) or N may be added. Addition of O or N makes it possible to improve the resistance or insulating performance of the non-linear resistive layer 15. However, too large additive amounts of O and N degrade the non-linearity of the non-linear resistive layer 15, and therefore composition (atomic ratio in %) of O and N that are contained in the non-linear resistive layer 15 may be preferably 50% or lower. Specifically, it may be preferable that the non-linear resistive device 10Y (the non-linear resistive layer 15) have a dielectric withstanding voltage of 1 $MV/cm^2$ or higher, and output a current with a current density of 10 $MA/cm^2$ or higher at an applied voltage of 2 V or lower. Within the range of such characteristics, a non-stoichiometric compound such as silicon oxide ($SiO_x$), silicon nitride ($SiN_x$), and silicon oxynitride ($SiO_xN_y$) may be used for the material of the non-linear resistive layer 15. A film thickness of the non-linear resistive layer 15 is not particularly limitative; however, the film thickness ranging from 1 nm to 20 nm, for example, may be preferable to suppress a flowing current at a low level in OFF state of the switch device and to deliver a large current in ON state.

It is to be noted that B, C, and Si are elements used for the switch layer 14 as well, and thus those elements are also preferred in that a similar etching condition is applicable in etching to be performed during microfabrication or any other process.

The intermediate electrode 13 is provided between the switch layer 14 and the non-linear resistive layer 15. As a material of the intermediate electrode 13, it may be preferable to use an inactive material that has electrical conductivity, and, for example, is less likely to cause, due to application of an electric field, redox reaction such as ion dissolution or precipitation, and ion migration into the switch layer 14 and the non-linear resistive layer 15 each containing a chalcogenide material. For example, it may be preferable to use a high-melting-point metal (for example, with a melting point of 1,800° C. or higher), or a compound thereof, which suppresses deterioration in the switch device 10X. Specific examples of the material may include titanium nitride (TiN), tantalum nitride (TaN), tungsten (W), tungsten nitride (WN), titanium tungsten (TiW), and titanium tungsten nitride (TiWN); however, it may be preferable to use W above all. It may be preferable to use W for not only the intermediate electrode 13, but also an electrode (the upper electrode 12 in this case) that is in contact with the switch layer 14. This is because a chalcogen element (for example, Te) that is contained in the switch layer 14 is likely to undergo reaction or alloying when it is brought into contact with an electrode material in use for a typical semiconductor circuit that contains Al, Cu, or any other material as a primary constituent, and occurrence of such a reaction significantly degrades the characteristics of the switch device 10X. Further, even in a case where the high-melting-point metal is used, for example, Ti is likely to be reacted with the chalcogenide material. Therefore, at a minimum, the switch layer 14 may be preferably structured to be brought into contact with an electrode made of the above-described high-melting-point metal, or a compound that is less likely to be reacted with Te.

The selective device 10A of the present embodiment may be brought into a low-resistance state by applying a voltage equal to or higher than the switching threshold voltage, while may return to a high-resistance state by lowering an applied voltage below the switching threshold voltage. In other words, the selective device 10A does not generate a change of phase (non-crystalline phase, i.e., amorphous phase and crystalline phase) of the switch layer 14 in association with voltage pulses or current pulses to be applied through the lower electrode 11 and the upper electrode 12 from an unillustrated power supply circuit (pulse-applying means). Further, the selective device 10A does not carry out an operation such as a memory operation ensuring that a conductive path to be formed by ion migration activated by an applied voltage is still retained even after removal of the applied voltage.

As described previously, a large-capacity memory (memory cell array) may be achieved by adopting a crosspoint array type where memory cells are disposed, in which a memory device and a switch device are stacked in the vicinity of a crosspoint between intersecting wiring lines, as illustrated in FIG. 7. Such a memory cell array of the crosspoint type allows for the use of a resistance-change memory device (for example, a memory device 20 described hereinafter) as the memory device. The resistance-change memory device contains various materials, and the memory device with a larger writing threshold voltage typically has higher record holding reliability. Further, the writing threshold voltage of the memory device has variations among devices. This necessitates to consider an extra margin for the writing threshold voltage in a large-sized memory cell array. For example, even when the memory device has the writing threshold voltage of one V, the switch device may preferably have a switching threshold voltage exceeding one V. For example, in a case where variation in the writing threshold voltage of a memory cell array is +/−0.3 V, the switching threshold voltage of the switch device may be desirably 1.3 V or higher. Therefore, to drive the memory device with the high writing threshold voltage (for example, 1.5 V or higher) and the high holding reliability without causing faulty write operation, yet higher switching threshold voltage is necessary for the switch device.

Examples of the switch device may include a bidirectional diode that is made of metal oxide, for example, a metal-insulator-metal (MIM) bidirectional diode. However, such a bidirectional diode is, in many cases, insufficient in a magnitude of a selection ratio (ON/OFF ratio) that is defined as a ratio of resistances or current values in ON state where the memory device is driven and in OFF state. For example, some types of the MIM diode that uses a material such as $NbO_x$ and $VO_x$ switch at a given threshold voltage; however, the MIM diode has a large leakage current in OFF state, and does not have a sufficiently large selection ratio. Further, in a case where the switch device and the memory device are coupled in series, the selection ratio is further reduced, which makes it difficult to operate a memory cell array that includes a plurality of memory devices, unlike the crosspoint memory cell. This is because the leakage current in OFF state is large, and the selection ratio is small.

In contrast, the OTS device that uses a chalcogenide material has a small leakage current in OFF state, a capability of increasing the current in ON state, and the above-described switching characteristics as mentioned previously, thus making it possible to achieve a relatively large selection ratio even in a case where the OTS device is coupled to the memory device in series. Therefore, the OTS device has been promising as a selective device used for a high-capacity memory such as the crosspoint memory cell.

However, in a case where the OTS device is used for the crosspoint memory cell, when a current with a large current density of 10 $MA/cm^2$, for example, is applied, and further the operation is performed repeatedly with such a large current density, there has been an issue in which the switching threshold voltage may be lowered, or variations in the switching threshold voltage among the plurality of disposed OTS devices may increase. This is because a so-called negative resistance is generated, in which a resistance of the OTS device drops drastically during switching operation (an apparent resistance drops down to almost 0 or a negative value). When an attempt is made to achieve a high current density in the crosspoint memory cell configured by the OTS device, the negative resistance is generated during switching operation of the OTS device, thus resulting in instantaneous flow of the overcurrent. This deteriorates the OTS device (specifically, a chalcogenide layer made of a chalcogenide material), thus leading to a drop in the switching threshold voltage, and an increase in variations in the switching threshold voltage.

As a method for solving such an issue, it is considered to combine a device having a current control capability with the OTS device. FIG. 3 illustrates current-voltage characteristics of a linear resistive device. FIG. 4A illustrates current-voltage characteristics when the non-linear resistive device having non-linear current-voltage characteristics as illustrated in FIG. 2 and the switch device are coupled in series, and FIG. 4B illustrates current-voltage characteristics when the device (linear resistive device) having linear current-voltage characteristics as illustrated in FIG. 2 and the switch device are coupled in series. As appreciated from FIG. 4A, a selective device that is formed, in which the non-linear resistive device is coupled in series to the switch device, exhibits switching characteristics irrespective of resistances of the non-linear resistive device, thus allowing for a change in a sustaining voltage. It is to be noted that the sustaining voltage is also referred to as a hold voltage, and refers to a voltage in an inflection point where a voltage starts to rise again after the voltage is lowered during switch operation as illustrated in FIG. 4A. In contrast, as appreciated from FIG. 4B, in a case where the linear resistive device and the switch device are combined, when the linear resistive device having a large resistance is used to improve the dielectric withstanding voltage performance of the switch device, ON current is also limited, thus resulting in loss of the switching characteristics. As appreciated from the above, the combined use of the switch device and the non-linear resistive device raises the sustaining voltage without having a significant influence on the ON current, thus making it possible to control the switching threshold voltage. In other words, it is possible to suppress deterioration in the repeated characteristics of the switch device, or degradation caused by applied current and voltage. Further, unlike the linear resistive device, the non-linear resistive device makes it possible to assure ON current, thus enabling a drive current density to be achieved. This allows for obtaining a drive current that is necessary at the time of rewriting of the memory device even in a miniaturized memory cell.

Accordingly, the non-linear resistive device is considered to be preferred as a current control device to be combined with the switch device. Here, examples of a typical non-linear resistive device may include a non-linear resistive device that uses a material such as $TiO_2$. However, such a non-linear resistive device is not satisfactory in characteristics such as specific resistance and dielectric withstanding voltage performance; a $TiO_2$ material is destroyed in a case where a current with a large current density of 10 $MA/cm^2$, for example, is applied as mentioned above, which makes it difficult to achieve satisfactory effects as the current control device. As an alternative, the effects are obtainable by increasing a film thickness of the non-linear resistive device. In this case, however, the increased film thickness interferes with miniaturization of a memory cell.

In contrast, in the selective device 10A of the present embodiment, as a current control device to be coupled to the switch device 10X in series, the non-linear resistive device 10Y is used that contains one or more of boron (B), silicon (Si), and carbon (C). Specifically, between the lower electrode 11 and the upper electrode 12 that are disposed to face each other, the switch layer 14 and the non-linear resistive layer 15 that contains one or more of B, Si, and C are stacked with the intermediate electrode 13 in between. This makes it possible to control the current to be applied to the switch device 10X.

Accordingly, in the selective device 10A of the present embodiment, the non-linear resistive device 10Y that contains one or more of boron (B), silicon (Si), and carbon (C) is coupled to the switch device 10X in series. This makes it possible to control the current to be applied to the switch device 10X, and to protect the switch layer 14 that configures the switch device 10X, thereby allowing the withstanding current performance to be improved.

It is to be noted that, in the selective device 10 of the present embodiment, the switch device 10X and the non-linear resistive device 10Y have only to be coupled in series, and a stacking order of the switch layer 14 and the non-linear resistive layer 15 that are stacked between the lower electrode 11 and the upper electrode 12 with the intermediate electrode 13 in between does not matter specifically. For example, as with a selective device 10B illustrated in FIG. 5, layers may be stacked in such a manner that the switch layer 14 is placed on the lower electrode side, and the non-linear resistive layer 15 is placed on the upper electrode side with the intermediate electrode 13 in between. Alternatively, in a manner of adjusting a resistance of the non-linear resistive layer 15 by varying properties such as a composition and film thickness thereof, a structure may be adopted, for example, in which the switch layer 14 and the non-linear resistive layer 15 are directly stacked without using the intermediate electrode 13, as with selective devices 10C and 10D illustrated in FIG. 6A and FIG. 6B, respectively.

The selective devices 10C and 10D both eliminating the intermediate electrode 13 tend to have a relatively high resistance in OFF state even when film thicknesses of the switch layer 14 and the non-linear resistive layer 15 are the same as those of the selective devices 10A and 10B both using the intermediate electrode 13. This is because the area of the non-linear resistive device 10Y is identical to a size of the device itself for the selective devices 10A and 10B both using the intermediate electrode 13, whereas a size of a filament that is formed on the switch layer 14 is considered to be a substantive device size for the selective devices 10C and 10D both eliminating the intermediate electrode 13. Therefore, the resistance or the non-linearity of the non-linear resistive layer 15 of each of the selective devices 10C and 10D both eliminating the intermediate electrode 13 may be preferably adjusted by varying a film thickness in such a manner that a current may flow which is greater than the leakage current in OFF state of the switch layer 14 by one to four orders of magnitude. Specifically, depending on sizes of the selective devices 10C and 10D, the film thickness of the non-linear resistive layer 15 may preferably range, for example, from one fifth to one half, or less in comparison with the selective devices 10A and 10B both using the intermediate electrode 13. Further, in a case where a resistance is adjusted by varying a composition ratio of the non-linear resistive layer 15, the resistance may also range from one fifth to one half, or less.

1-2. Storage Unit

It is possible to configure a storage unit (memory) by disposing a plurality of memory devices 20 described hereinafter in a column manner or in matrix, for example. In this case, the selective device 10 of the present embodiment of the disclosure is configured in such a manner that the switch device 10X and the non-linear resistive device 10Y as described above are coupled in series, and the selective device 10 is further coupled to the memory device 20 in series to configure a memory cell 2. The memory cell 2 is coupled to a sense amplifier, an address decoder, write/erasure/read circuits, or any other associated circuits through wiring lines such as bit lines (BL) and word lines (WL).

FIG. 7 illustrates an example of a storage unit (memory cell array 1A) of a so-called crosspoint array type in which the memory cell 2 is disposed at an intersection (crosspoint) between intersecting wiring lines. In the memory cell array 1A, each of the memory cells 2 is provided with a wiring line to be coupled to the lower electrode 11 side thereof (for example, the bit line BL, i.e., row line), and a wiring line to be coupled to the upper electrode 12 side thereof (for example, the word line WL, i.e., longitudinal line) in such a manner that those wiring lines intersect with each other, and, for example, each of the memory cells 2 is disposed in the vicinity of the intersection of those wiring lines. In such a manner, the use of the crosspoint array structure makes it possible to reduce the floor area per unit cell, thereby allowing large amounts of storage capacity to be achieved. Further, by adopting a three-dimensional stereoscopic structure in which layers each having a unit structure that includes the bit line, the memory cell 2, and the word line are stacked in a Z-axis direction, it is possible to achieve a higher-density and higher-capacity memory. It is to be noted that a structure in which the bit line or the word line is shared by upper and lower memory cells may also be adopted. Alternatively, an unillustrated interlayer insulating film may also be provided between stacked layers of the unit structure that includes the bit line, the memory cell 2, and the word line.

The memory device 20 that configures the memory cell 2 has, for example, the lower electrode 11, a storage layer 21, and the upper electrode 12 in this order. The storage layer 21 is configured by, for example, a stacked structure in which a resistance-change layer 23 and an ion source layer 22 are stacked from the lower electrode 11 side, or a single layer structure of the resistance-change layer 23. It is to be noted that an intermediate electrode 24 is provided between the switch layer 14 and the storage layer 21 in this case, and the intermediate electrode 24 serves both as an upper electrode of the selective device 10 and a lower electrode of the memory device 20. Specifically, for example, as illustrated in FIG. 8A, the memory cell 2 has a configuration (a memory cell 2A) in which the resistance-change layer 23, the ion source layer 22, the intermediate electrode 24, the non-linear resistive layer 15, the intermediate electrode 13, and the switch layer 14 are stacked in this order between the lower electrode 11 and the upper electrode 12.

The storage layer 21 may be a so-called resistance-change memory device (memory device) that has a configuration, for example, in which the ion source layer 22 and the resistance-change layer 23 are stacked as described above. Specifically, for example, a resistance-change memory made of transition metal oxide, a phase-change memory (PCM), or a magnetic resistance-change memory (MRAM) may also be used.

The ion source layer 22 contains movable elements that form a conduction path inside the resistance-change layer 23 with application of an electric field. Examples of the movable element may include transition metal element (the fourth to the sixth groups of the periodic system) and chalcogen element; the ion source layer 22 is configured to contain one, or two or more of those respective elements. Further, the ion source layer 22 may preferably contain oxygen (O), nitrogen (N), and elements other than the above-described elements, such as Al, Cu, zirconium (Zr), and hafnium (Hf). In addition to the above-described elements, the ion source layer 22 may also contain elements such as manganese (Mn), cobalt (Co), iron (Fe), nickel (Ni), platinum (Pt), and Si.

The resistance-change layer 23 contains, for example, oxide or nitride of a metal element or a non-metal element, and a resistance thereof changes in a case where a predetermined voltage is applied across the lower electrode 11 and the upper electrode 12. Specifically, when a voltage is applied across the lower electrode 11 and the upper electrode 12, the transition metal element contained in the ion source layer 22 migrates into the resistance-change layer 23 to form a conduction path, thus bringing the resistance-change layer 23 into a low-resistance state. Alternatively, a structural defect such as an oxygen defect and a nitrogen defect occurs inside the resistance-change layer 23 to form the conduction path, thus bringing the resistance-change layer 23 into the low-resistance state. Further, by applying a reversely-oriented voltage, the conduction path is cut off, or the electrical conductivity varies, thus bringing the resistance-change layer 23 into a high-resistance state.

It is to be noted that all of the metal element and the non-metal element that are contained in the resistance-change layer 23 may not necessarily have to remain in a state of oxide, and may remain also in a partially oxidized state. Further, for an initial resistance of the resistance-change layer 23, it may be preferable to achieve a device resistance ranging from, for example, about several megaohms to several hundred gigaohms. For a film thickness of the resistance-change layer 23, the film thickness may preferably range from 1 nm to 10 nm, for example, although an optimal value may vary depending on a device size or a resistance of the ion source layer 22.

The intermediate electrode 24 is provided between the selective device 10 and the memory device 20. It is sufficient to use, for example, an inactive material that is less likely to cause, due to application of an electric field, redox reaction such as ion dissolution or precipitation, and ion migration into the switch layer 14 and the ion source layer 22 each containing a chalcogenide material; a material similar to that of the above-described intermediate electrode 13 may be used. It is to be noted that, in a case where the intermediate electrode 24 is brought into contact with the non-linear resistive layer 15, the material may not necessarily have to be W or any other high-melting-point metal; different materials for the intermediate electrode 24 may be used on side in contact with the switch layer 14 and on side in contact with the non-linear resistive layer 15, respectively. Therefore, as a material used for the intermediate electrode 24, known materials for typical wiring materials, such as Cu, Al, and TiN may also be used.

It is to be noted that a stacking structure of the memory cell 2 in the memory cell array 1A having a crosspoint array structure is not limited to the memory cell 2A in which the selective device 10A and the memory device 20 are stacked as illustrated in FIG. 8A; any of stacking structures as illustrated, for example, in FIGS. 8B to 8F may also be employed. A memory cell 2B illustrated in FIG. 8B has a configuration in which the selective device 10B illustrated in FIG. 5 and the memory device 20 are stacked with the intermediate electrode 24 in between, and a memory cell 2C illustrated in FIG. 8C has a reversed stacking order of the selective device 10B and the memory device 20. A memory cell 2D illustrated in FIG. 8D provides the memory device 20 between the switch device 10X and the non-linear resistive device 10Y both configuring the selective device 10. Alternatively, the intermediate electrodes 13 and 24 may be omitted as appropriate, and a memory cell 2E illustrated in FIG. 8E omits the intermediate electrode 24 that is interposed between the memory device 20 and the non-linear resistive layer 15 in the memory cell 2D illustrated in FIG. 8D. Further, in a case where the switch device 10X, the non-linear resistive device 10Y, and the memory device 20 are stacked directly, as with a memory cell 2F illustrated in FIG. 8F, the switch device 10X and the memory device 20 may be preferably stacked with the non-linear resistive device 10Y in between. By disposing the non-linear resistive layer 15 in between, it is possible to reduce diffusion of mobile ions in the ion source layer 22 configuring the memory device 20 into the switch layer 14 configuring the switch device 10X, and to prevent loss of proper operation as the switch device, i.e., the OTS operation.

The memory device 20 is a resistance-change memory device in which the electrical characteristics (resistance) of the storage layer 21 are changed when a voltage pulse or a current pulse is applied through the lower electrode 11 and the upper electrode 12 from an unillustrated power supply circuit (pulse-applying means), thereby allowing writing, erasure, and further reading of information to be carried out.

Specifically, in the memory device 20, when a "positive-direction" (for example, a negative potential on first electrode side, and a positive potential on second electrode side) voltage or a current pulse is applied to a device in an initial state (high-resistance state), the metal element (for example, transition metal element) contained in the ion source layer is ionized to be diffused into the storage layer (for example, the resistance-change layer), or oxygen ions migrate, which causes an oxygen defect to be generated in the resistance-change layer. This results in formation of a low-resistance portion (a conduction path) in a low oxidation state in the storage layer, leading to reduction in the resistance of the resistance-change layer (a record state). When a "negative-direction" (for example, a positive potential on the first electrode side, and a negative potential on the second electrode side) voltage pulse is applied to the device in such a low-resistance state, metal ions in the resistance-change layer migrate into the ion source layer, or oxygen ions migrate from the ion source layer to decrease the oxygen defect in the conduction path portion. This causes the conduction path containing the metal element to disappear, thus bringing the resistance-change layer into a high-resistance state (initial state or erasure state). It is to be noted that, in a case where the storage layer 21 is configured by a single layer of the resistance-change layer 23, a defect is generated due to application of an electric field to the resistance-change layer 23 when a positive-direction voltage (or a current pulse) is applied, and the defect is restored by migration of oxygen ions or nitrogen ions in the resistance-change layer when a voltage pulse is applied in a negative direction.

It is to be noted that a structure of the memory cell array of the crosspoint array type is not limited to the memory cell array 1A illustrated in FIG. 7. For example, as in the memory cell 2B illustrated in FIG. 9, a structure may be adopted in which the WL extends in the Y-axis direction, while the BL extends in the Z-axis direction, and the memory cell 2 is provided at an intersection where the WL and the BL face each other. Further, the WL and the BL may not necessarily have to extend in a single direction, and a structure may be employed in which a portion of the WL extends in the X-axis direction or the Z-axis direction. Alternatively, the WL may be disposed to be inflective continuously from the X-axis direction to the Y-axis direction.

It is to be noted that, in a case where configurations of so-called PCM and MRAM are applied to the storage layer 21 as well, the storage unit in the present embodiment has a configuration similar to the above.

2. Modification Examples

2-1. Modification Example 1

FIG. 10 illustrates a cross-sectional configuration of a selective device 30 as a modification example according to the above-described embodiment of the disclosure. The selective device 30 is different from the above-described embodiment in that a constant-current diode is used as a non-linear resistive device 30Y to be coupled to the switch device 10X in series. FIG. 11 illustrates a cross-sectional configuration of a memory cell that uses the selective device 30 according to the present modification example. FIG. 11 schematically illustrates a specific configuration in which, for example, a junction field-effect transistor is used as the constant-current diode that is the non-linear resistive device 30Y. Further, any components same as those in the above-described embodiment are denoted with the same reference numerals, and the related descriptions are omitted.

The non-linear resistive device 30Y is a constant-current diode as described above, and is specifically a so-called junction field-effect transistor having a configuration in which a gate electrode and a drain electrode or a source electrode are integrated. The current-voltage characteristics of the constant-current diode exhibit a non-linear resistance change as illustrated in FIG. 12. A depletion layer region (a region that is brought into a high-resistance state because majority carriers are hardly present, and minority carriers are only present) exists between a p-type region and an n-type region of the constant-current diode (junction field-effect transistor), and such a region limits the current flowing through the n-type channel region. For such a depletion-type junction field-effect transistor, a channel region thereof is not blocked by the depletion layer region even when a gate-source voltage becomes zero. Therefore, the I-V curve of the junction field-effect transistor exhibits a change as illustrated in FIG. 12. In other words, when a drain-source voltage is still small, a size of the depletion layer region is not changed, thus resulting in flowing of a current proportional to a voltage. This voltage range is referred to as a linear region, which exhibits no constant-current action. When the drain-source voltage becomes large, the channel region is blocked by the depletion layer region, thus resulting in flowing of only a constant current. This voltage range is referred to as a saturated region, which exhibits the constant-current characteristics. When the drain-source voltage becomes still larger, insulation of the depletion layer region is broken to start growth of the minority carriers, leading to rapid flow of a large current. A voltage at the time when such a large current starts to flow is a dielectric breakdown voltage of a transistor, and the constant-current action is lost beyond such a voltage range.

The non-linear resistive device 30Y has, as a non-linear resistive layer 35, an n-type channel region 351 in which the element belonging to the 15th group of the periodic system, such as N is doped as a donor element with an Si or SiC semiconductor, and a p-type gate region 352 in which the element belonging to the 13th group of the periodic system, such as B is doped as an acceptor element with a surface of an n-type substrate. The p-type gate region 352 has a cross-sectional area that is smaller than an inner diameter of a contact hole structure to be formed at an intersection of the BL and the WL of the crosspoint memory cell array in a vertical direction. It is to be noted that, at a junction between the upper electrode 12 and the n-type channel region 351, and a junction between the upper electrode 12 and the intermediate electrode 24, an n-type channel region (although not illustrated in FIG. 11) is provided in which a donor element such as N is heavily doped.

Hereinafter, description is provided on a current control effect of the junction field-effect transistor. In the present modification example, the upper electrode 12 serves as a drain electrode or a source electrode, while the intermediate electrode 24 serves as the source electrode or the drain electrode, and a depletion layer is formed between the n-type channel region 351 and the p-type gate region 352 in a state where a gate potential becomes equipotential to the drain electrode or the source electrode. When a set current Icomp flowing between the drain electrode and the source electrode attempts to exceed a limiting value Ilimit, a region of the depletion layer becomes larger to narrow down a current-flowing channel, leading to an increase in the resistance. When the set current Icomp does not exceed the limiting value Ilimit, the resistance is lowered down to an original value, thus resulting in constant-current operation being performed.

The selective device 10 mentioned in the above-described embodiment and the selective device 30 in the present modification example are coupled to the memory device 20 in series to thereby allow for selection of any of a plurality of memory devices disposed in a column manner or in matrix in the memory cell array. In other words, it is considered that the selective device 10 and the selective device 30 serve to suppress generation of a sneak current during write/read operation of the memory device 20.

FIG. 13 illustrates current-voltage characteristics of a diode having, for example, a BCTeN layer with a film thickness of 20 nm that is used as a typical selective device. This selective device is a kind of a bidirectional Schottky barrier diode, and both ends of the BCTeN layer are coupled to an inert metal electrode made of a material such as TiN and W. The selective device has two states including OFF state where a current is hardly applied, and ON state that enables a large current to be applied. To make switchover between the ON state and the OFF state, it is necessary to apply a voltage equivalent to a switching threshold voltage Vb across both ends of the BCTeN layer. As seen in FIG. 13, a phenomenon (negative differential resistance) where a differential resistance of the current-voltage characteristics becomes negative during state transition between the OFF state and the ON state is often observed in a case where a chalcogen element is contained. Such a phenomenon may be observed in some cases in an insulating material having many trap levels even in a case where the chalcogen element is not contained. Here, given that a full voltage to be applied to the crosspoint memory cell array is Vin, a load line of the selective device is represented by a straight line connecting a maximum current Vin/$R_A$ that is determined by Vin and a resistance $R_A$ of a memory device. The set current Icomp flowing through the memory device is on this load line, and is represented by the following expression when a hold voltage of the selective device is Vh, and an ON-resistance of the selective device is Ron. However, the ON-resistance Ron has current dependency, and thus it is not possible to precisely determine the set current Icomp.

$$Icomp=(V-Vh)/Ron \qquad \text{(Expression 1)}$$

FIG. 14 is a characteristic diagram illustrating a relationship between an inverse 1/$R_A$ of a set resistance and a set current Icomp of a typical non-volatile memory device that makes it possible to store a resistance of a resistive layer provided between a pair of electrodes in a non-volatile manner. This non-volatile memory device is a kind of an ion-conducting memory with a film thickness of 4 nm that has an $Al_2O_3$ layer as the resistive layer. An inert metal electrode made of a material such as TiN is coupled to one end surface of the resistive layer, and an active electrode made of a material such as Cu, Zr, Al, and Te is coupled to the other end surface. Such an active electrode corresponds to the ion source layer mentioned in the above-described embodiment. The inverse 1/$R_A$ of the set resistance (i.e., a set conductance) has a property of being proportional to the set current Icomp, and it would be possible to determine the set resistance precisely with strict application of only the set current. However, in a case where the selective device and the memory device are combined, the ON-resistance Ron or the hold voltage Vh of the selective device varies, which makes it difficult to determine a unique set current, thus resulting in variations in the set resistance itself. When the set resistance varies, one end (maximum current Vin/$R_A$) of the load line for the selective device also fluctuates, thus causing variations in the set current Icomp to be further increased.

In contrast, the non-linear resistive device makes it possible to limit the set current Icomp flowing through the crosspoint memory cell array to a constant value. Further, because the non-linear resistive device has no functionality of reducing a reset current or a sneak current, no functional overlapping with the typical selective device as described above takes place.

Therefore, in the crosspoint memory cell array, by using, as the selective device configuring the memory cell, a new selective device in which the non-linear resistive device is coupled in series to the typical selective device as described above, it is possible to stabilize a maximum current, i.e., the set current flowing through the memory cell at a constant value. Once the set current remains at a constant value at all times, the resistance of the memory device is also set at a constant value.

As described above, the use of the constant-current diode as the non-linear resistive device 30Y also makes it possible to achieve the effects similar to those of the above-described embodiment, and further the effect is achieved that allows for improvement of the controllability of a memory cell 3.

In addition, it is possible to reduce an influence of external noise, for example. Once a resistance of the memory device is set at a constant value, it is possible to improve resistance separation characteristics corresponding to a binary state of a high-resistance state (0) and a low-resistance state (1), and to enlarge an array size of the crosspoint memory cell array, as well as to achieve a higher-capacity and lower-cost memory (storage unit).

2-2. Modification Example 2

FIG. 15 illustrates a cross-sectional configuration of a selective device 40 as a modification example according to the above-described embodiment of the disclosure. As with the above-described modification example 1, the selective device 40 uses a junction field-effect transistor as a non-linear resistive device 40Y; however, the present modification example is different from the above-described modification example in that a potential different from a potential on each of the BL and WL is applied to a gate electrode (gate electrode 453). FIG. 16 illustrates a cross-sectional configuration of a memory cell that uses the selective device 40 according to the present modification example. FIG. 16 schematically illustrates a specific configuration of a junction field-effect transistor that is used as the non-linear resistive device 40Y. It is to be noted that any components same as those in the above-described embodiment are denoted with the same reference numerals, and the related descriptions are omitted.

The non-linear resistive device 40Y is the junction field-effect transistor as described above, and is different from the above-described modification example 1 in that the gate electrode 453 is provided independently of the upper electrode 12 that serves as a drain electrode and a source electrode. FIG. 17 illustrates current-voltage characteristics of the non-linear resistive device 40Y. In a memory cell 4 of the present modification example, by controlling voltages (for example, Vg1, Vg2, Vg3, ... ) to be applied to the gate electrode 453, it is possible to achieve corresponding limiting values (for example, Ilimit1, Ilimit2, Ilimit3, ... ). This is because it is possible to control a size of a depletion layer region that is formed between an n-type channel region 451 and a p-type gate region 452. By controlling voltages to be applied to the gate electrode 453 in such a manner, it is possible to stabilize a maximum current (set current Icomp) that flows through the memory cell at a corresponding value. This improves the controllability of a plurality of intermediate resistance states that are set up between a high-resistance state and a low-resistance state, thereby enabling multiple-value recording of the memory cell 4.

Accordingly, in the selective device 40 in the present modification example, and the memory cell 4 provided with the selective device 40, the resistance separation characteristics of the plurality of intermediate resistance states that are requested for the multiple-value recording and are set up between the high-resistance state and the low-resistance state are improved in addition to the effects of the above-described modification example 1, thus achieving the effect that allows for still higher capacity and lower cost.

3. Working Examples

Hereinafter, description is provided on specific working examples of the disclosure.

(Experiment 1)

First, after the lower electrode 11 made of TiN was cleaned using reverse sputtering treatment, a BCTeN film with a film thickness of 20 nm was formed as the switch layer 14 on the TiN, and thereafter a W film with a film thickness of 1 nm was formed as the intermediate electrode 13. Next, a $B_4C$ film with a film thickness of 10 nm was formed as the non-linear resistive layer 15 on the W film, and thereafter a W film with a film thickness of 30 nm was further formed as the upper electrode 12. Subsequently, to achieve a device size of 100 nm φ, microfabrication was performed using known techniques such as photolithography and dry etching to produce the selective device 10A (experimental example 1-1). Further, a selective device provided with no non-linear resistive layer 15 (only the switch device 10X; experimental example 1-2) and a selective device with a $TiO_2$ film formed thereon (experimental example 1-3) as the non-linear resistive device 10Y (non-linear resistive layer 15) were produced as comparative examples. The composition of each layer in Experimental Examples 1-1 to 1-3 is given below in the order of the lower electrode/switch layer/intermediate electrode/non-linear resistive layer/upper electrode. In these experimental examples 1-1 to 1-3, three types of series resistors (A: 5 kΩ, B: 18.5 kΩ, and C: 37 kΩ) were coupled, and a measurement was made for a current change (resistance change) relative to an applied voltage at drive current of 1 mA, 20 μA, and 100 μA.

(Experimental Example 1-1):
TiN/BCTeN/W/$B_4C$/W (Experimental Example 1-2): TiN/BCTeN/-/-/W (Experimental Example 1-3):
TiN/BCTeN/W/$TiO_2$/W Each of FIGS. 18A, 18B, 18C, 19A, 19B, 19C, 20A, 20B and 20C illustrates a relationship (current-voltage characteristics) between an applied voltage and a value of a current flowing through each electrode at each drive current of about 0.8 mA (A: 5 kΩ), about 200 μA (B: 18.5 kΩ), and about 100 μA (C: 37 kΩ) in Experimental Example 1-1 (FIGS. 18A, 18B and 18C), Experimental Example 1-2 (FIGS. 19A, 19B and 19C), and Experimental Example 1-3 (FIGS. 20A, 20B and 20C).

As appreciated from FIGS. 19A, 19B and 19C, in Experimental Example 1-2 in which only the switch layer 14 was provided between the lower electrode 11 and the upper electrode 12 that are typical selective devices (OTS devices), satisfactory switching operation was observed; however, values of series resistors coupled for measurement were small, and variations in the switching operation and a decrease in the switching threshold voltage were observed as the drive current increased. In this experiment, each DC loop was performed repeatedly five times at the current density of about 9 $MA/cm^2$ (A), about 2 $MA/cm^2$ (B), and about 1 $MA/cm^2$ (C) that are calculated in terms of the drive current and device size (110 nm φ). On the assumption that, for example, 20 μmA of current is necessary for driving a memory device of 20 nm φ, the current density is about 8 $MA/cm^2$, and the drive current of 0.8 mA corresponds to such a current density in this experiment. Because a memory cell is actually driven by pulse application in a short period of time, this value is not applicable as it is. However, in the memory cell in Experimental Example 1-2, it was appreciated that it was more difficult to keep satisfactory characteristics as the current density increased.

In contrast, in Experimental Example 1-1 that is the working example of the disclosure, it was possible to keep satisfactory characteristics without reduction in the switching threshold voltage even when the drive was performed at 0.8 mA that was equivalent to the largest current density, as appreciated from of FIG. 18A. It is considered that this was because the non-linear resistive layer 15 made of $B_4C$ was provided as the non-linear resistive device 10Y.

Further, in Experimental Example 1-3 as a comparative example of the disclosure, a non-linear resistive layer made of $TiO_2$ was provided as the non-linear resistive device 10Y, as appreciated from FIGS. 20A, 20B and 20C. In this memory cell, satisfactory switching characteristics were obtained at up to 100 μA of drive current. However, when the drive current exceeds 200 μA, the switching threshold voltage was lowered, and variations in the switching threshold voltage became prominent.

Accordingly, it was appreciated that, as with the selective device 10 of the disclosure, by coupling the non-linear resistive device 10Y that contains B to the switch device 10X in series, it became possible to reduce deterioration of the switch device 10X due to a large drive current, and to reduce a decrease in the switching threshold voltage as well as an increase in variations in the switching threshold voltage. Further, even for the same non-linear resistive device, the effects of the present embodiment of the disclosure were not achievable from the non-linear resistive device including a non-linear resistive layer made of $TiO_2$. It is inferred that this may be possibly caused by a high dielectric constant, for example. The dielectric constant of $TiO_2$ ranges from about 70 to about 100, and the dielectric constant of $B_4C$ is 10 or lower. In other words, to achieve sufficient withstanding current performance, it is considered that the dielectric constant of the non-linear resistive layer may be preferably a fixed value or lower, for example, 20 or lower, and more preferably 10 or lower.

It is to be noted that, in the present working examples, $B_4C$ was used as a constituent material of the non-linear resistive layer 15; however, it is possible to adjust a composition ratio of B to C unless it deviates from the gist of the prevent disclosure. Further, the similar effects are also achievable by using Si in addition to B and C, although description is not provided herein.

(Experiment 2)

Next, a constant-current diode serving as a non-linear resistive device was formed as the non-linear resistive layer 35, and the selective device 30 (experimental example 2-1) having a configuration similar to the above-described Experiment 1, other than the non-linear resistive layer 35, was produced. Further, as a comparative example, a selective device having a configuration similar to that of the selective device 30 (experimental example 2-2), other than absence of a non-linear resistive layer, was produced. Thirty pieces of these selective devices were produced, and the respective current-voltage characteristics thereof were measured.

FIGS. 21A and 21B illustrate, in a superimposed manner, the current-voltage characteristics of the respective thirty pieces of the selective devices in Experimental Example 2-1 (FIG. 21A) and Experimental Example 2-1 (FIG. 21B). As appreciated from FIG. 21A, also in a case where the constant-current diode was used as the non-linear resistive device 30Y, it was possible to reduce variations in the memory cell 2 as compared with Experimental Example 2-2 in which no non-linear resistive device is provided, as with Experimental Example 1-1 in Experiment 1. It is considered that this is because the use of the constant-current diode allowed the memory device 20 to be protected against overcurrent, and allowed variations in a cycle life as well as in a resistance of the memory device 20 to be reduced.

It is to be noted that effects described in the foregoing embodiment, modification examples, and working examples are not necessarily limitative, and may be any of effects described in the disclosure.

Further, the technology may also have the following configurations.

(1)

A selective device including:

a first electrode, a second electrode disposed to face the first electrode;

a switch device provided between the first electrode and the second electrode; and a non-linear resistive device that contains one or more of boron (B), silicon (Si), and carbon (C), the non-linear resistive device being coupled to the switch device in series.

(2)

The selective device according to (1), in which the non-linear resistive device has a non-linear resistive layer including an alloy or a compound that contains one or more of boron (B), silicon (Si), and carbon (C).

(3)

The selective device according to (1) or (2), in which the non-linear resistive device has a non-linear resistive layer that includes oxide, nitride, or oxynitride of any of boron (B) and silicon (Si).

(4)

The selective device according to any one of (1) to (3), in which the non-linear resistive device has a dielectric withstanding voltage of 1 MV/cm or higher, and applies a current with a current density of 10 MA/cm$^2$ or higher at a voltage of 2 V or lower that is applied to the non-linear resistive device.

(5)

The selective device according to any one of (1) to (4), in which the switch device includes a switch layer that is changed into a low-resistance state by increasing an applied voltage to a predetermined threshold voltage or higher, the switch layer being changed into a high-resistance state by decreasing the applied voltage to the predetermined threshold voltage or lower, or by removing the applied voltage.

(6)

The selective device according to (5), in which the switch layer contains one or more of tellurium (Te), boron (B), silicon (Si), carbon (C), and nitrogen (N).

(7)

The selective device according to any one of (1) to (6), in which the non-linear resistive device includes a constant-current diode.

(8)

The selective device according to (7), in which the constant-current diode includes a junction field-effect transistor.

(9)

The selective device according to any one of (1) to (8), in which the non-linear resistive device and the switch device are stacked with a third electrode in between.

(10)

The selective device according to (9), in which the third electrode is made of tungsten (W).

(11)

A memory cell provided with a memory device and a selective device coupled to the memory device, the selective device including:

a first electrode;

a second electrode disposed to face the first electrode;

a switch device provided between the first electrode and the second electrode; and a non-linear resistive device that contains one or more of boron (B), silicon (Si), and carbon (C), the non-linear resistive device being coupled to the switch device in series.

(12)

The memory cell according to (11), in which the memory device includes a storage layer between the first electrode and the second electrode of the selective device.

(13)

The memory cell according to (12), in which the storage layer includes an ion source layer and a resistance-change layer, the ion source layer containing one or more of tellurium (Te), aluminum (Al), copper (Cu), zirconium (Zr), nitrogen (N), and oxygen (O), the resistance-change layer being made of an oxide material.

(14)

The memory cell according to (12) or (13), in which the storage layer and any of the switch device and the selective device are stacked between the first electrode and the second electrode with a fourth electrode in between.

(15)

The memory cell according to any one of (12) to (14), in which the storage layer includes any of a resistance-change layer made of transition metal oxide, a phase-change memory layer, and a magnetic resistance-change memory layer.

(16)

A storage unit provided with a plurality of memory cells, the plurality of memory cells each including a memory device and a selective device coupled to the memory device, the selective device including:

a first electrode;

a second electrode disposed to face the first electrode;

a switch device provided between the first electrode and the second electrode; and a non-linear resistive device that contains one or more of boron (B), silicon (Si), and carbon (C), the non-linear resistive device being coupled to the switch device in series.

(17)

The storage unit according to (16), provided with a plurality of row lines and a plurality of column lines, in which the memory cell is disposed in a vicinity of each of intersecting regions of the plurality of row lines and the plurality of column lines.

This application is based upon and claims the benefit of the priority of Japanese Patent Application No. 2015-024608 filed with Japan Patent Office on Feb. 10, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A selective device, comprising:

a first electrode;

a second electrode that faces the first electrode;

a switch device that includes a switch layer, wherein
the switch layer is between the first electrode and the second electrode, and the switch layer is in direct contact with the first
electrode; and
a non-linear resistive device that comprises a non-linear
resistive layer, wherein
the non-linear resistive layer comprises at least one of
boron (B), silicon (Si), or carbon (C),
the non-linear resistive layer and the switch layer are
directly stacked between the first electrode and the
second electrode,
the non-linear resistive device further comprises a
junction field-effect transistor,
a gate electrode of the junction field-effect transistor is
independently of the second electrode, and
the second electrode corresponds to a drain electrode
and a source electrode of the junction field-effect
transistor.

2. The selective device according to claim 1, wherein the non-linear resistive layer further comprises one of an alloy of the at least one of boron (B), silicon (Si), or carbon (C), or a compound of the at least one of boron (B), silicon (Si), or carbon (C).

3. The selective device according to claim 1, wherein the non-linear resistive layer further comprises one of oxide, nitride, or oxynitride of one of boron (B) or silicon (Si).

4. The selective device according to claim 1, wherein
the non-linear resistive device is configured to:
withstand a dielectric withstanding voltage of at least 1 MV/cm, and
output a current with a current density of at least 10 MA/cm² at a voltage of at least 2 V.

5. The selective device according to claim 1, wherein the switch layer is configured to:
change from a high-resistance state to a low-resistance state based on an increase of an applied voltage to a threshold voltage or higher; and
change from the low-resistance state to the high-resistance state based on a decrease of the applied voltage to the threshold voltage or lower.

6. The selective device according to claim 5, wherein the switch layer comprises at least one of tellurium (Te), boron (B), silicon (Si), carbon (C), or nitrogen (N).

7. A memory cell, comprising:
a memory device; and
a selective device coupled to the memory device, wherein
the selective device comprises:
a first electrode;
a second electrode that faces the first electrode;
a switch device that includes a switch layer, wherein
the switch layer is between the first electrode and the second electrode, and
the switch layer is in direct contact with the first electrode; and
a non-linear resistive device that comprises a non-linear resistive layer, wherein
the non-linear resistive layer comprises at least one of boron (B), silicon (Si), or carbon (C),
the non-linear resistive layer and the switch layer are directly stacked between the first electrode and the second electrode,
the non-linear resistive device further comprises a junction field-effect transistor,
a gate electrode of the junction field-effect transistor is independently of the second electrode, and
the second electrode corresponds to a drain electrode and a source electrode of the junction field-effect transistor.

8. The memory cell according to claim 7, wherein the memory device comprises a storage layer between the first electrode and the second electrode.

9. The memory cell according to claim 8, wherein
the storage layer comprises an ion source layer and a resistance-change layer,
the ion source layer comprises at least one of tellurium (Te), aluminum (Al), copper (Cu), zirconium (Zr), nitrogen (N), or oxygen (O), and
the resistance-change layer comprises an oxide material.

10. The memory cell according to claim 8, further comprising
a third electrode, wherein
the storage layer and the selective device are between the first electrode and the second electrode, and
the third electrode is in between the storage layer and the selective device.

11. The memory cell according to claim 8, wherein
the storage layer comprises at least one of a resistance-change layer, a phase-change memory layer, or a magnetic resistance-change memory layer, and
the resistance-change layer comprises a transition metal oxide.

12. A storage unit, comprising:
a plurality of memory cells, wherein each memory cell of the plurality of memory cells comprises:
a memory device; and
a selective device coupled to the memory device, wherein the selective device comprises:
a first electrode;
a second electrode that faces the first electrode;
a switch device that includes a switch layer, wherein
the switch layer is between the first electrode and the second electrode, and
the switch layer is in direct contact with the first electrode; and
a non-linear resistive device that comprises a non-linear resistive layer, wherein
the non-linear resistive layer comprises at least one of boron (B), silicon (Si), or carbon (C),
the non-linear resistive layer and the switch layer are directly stacked between the first electrode and the second electrode,
the non-linear resistive device further comprises a junction field-effect transistor,
a gate electrode of the junction field-effect transistor is independently of the second electrode, and
the second electrode corresponds to a drain electrode and a source electrode of the junction field-effect transistor.

13. The storage unit according to claim 12, further comprising a plurality of row lines and a plurality of column lines, wherein the plurality of memory cells is adjacent to each of a plurality of intersecting regions of the plurality of row lines and the plurality of column lines.

14. A selective device, comprising:
a first electrode;
a second electrode that faces the first electrode;
a switch device that includes a switch layer, wherein
the switch layer is between the first electrode and the second electrode, and
the switch layer is in direct contact with the first electrode; and
a non-linear resistive device that comprises a constant-current diode, wherein the non-linear resistive device and the switch device are directly stacked between the first electrode and the second electrode, the constant-current diode is a junction field-effect transistor, a gate electrode of the junction field-effect transistor is independently of the second electrode, and the second electrode corresponds to a drain electrode and a source electrode of the junction field-effect transistor.

15. The selective device according to claim 14, wherein the non-linear resistive device further comprises at least one of boron (B), silicon (Si), or carbon (C).

16. The selective device according to claim 14, wherein the non-linear resistive device is configured to:

withstand a dielectric withstanding voltage of at least 1 MV/cm, and output a current with a current density of at least 10 $MA/cm^2$ at a voltage of at least 2 V.

* * * * *